United States Patent
Park et al.

(10) Patent No.: US 9,703,280 B2
(45) Date of Patent: Jul. 11, 2017

(54) METHOD AND APPARATUS FOR FABRICATING SEMICONDUCTOR DEVICE

(71) Applicant: SAMSUNG ELECTRONICS CO., LTD., Suwon-si, Gyeonggi-do (KR)

(72) Inventors: Han-Hum Park, Suwon-si (KR); Sung-Won Choi, Yongin-si (KR); Chang-Ho Han, Hwaseong-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 238 days.

(21) Appl. No.: 14/625,907

(22) Filed: Feb. 19, 2015

(65) Prior Publication Data
US 2016/0005590 A1   Jan. 7, 2016

(30) Foreign Application Priority Data
Jul. 4, 2014 (KR) .................. 10-2014-0083728

(51) Int. Cl.
| H01L 21/02 | (2006.01) |
| G05B 19/402 | (2006.01) |
| G03F 7/20 | (2006.01) |
| H01L 21/66 | (2006.01) |

(52) U.S. Cl.
CPC ....... *G05B 19/402* (2013.01); *G03F 7/70633* (2013.01); *H01L 22/12* (2013.01); *H01L 22/20* (2013.01); *G05B 2219/45031* (2013.01)

(58) Field of Classification Search
CPC ........ G05B 19/402; G05B 2219/45031; G03F 7/70633; H01L 22/12; H01L 22/20
See application file for complete search history.

(56) References Cited

U.S. PATENT DOCUMENTS

| 5,748,508 A | 5/1998 | Baleanu |
| 6,628,371 B1 * | 9/2003 | Ishikawa ............... G03B 27/72 |
| | | 250/492.2 |
| 6,716,649 B2 | 4/2004 | Ziger |
| 7,333,200 B2 | 2/2008 | Sezginer et al. |
| 7,571,420 B2 | 8/2009 | Wong et al. |
| 7,684,965 B2 | 3/2010 | Sekine et al. |
| 7,879,516 B2 * | 2/2011 | Kawachi ............ G03F 7/70558 |
| | | 356/237.1 |
| 8,090,464 B2 | 1/2012 | Bomholt et al. |
| 8,577,494 B2 | 11/2013 | Miwa et al. |

(Continued)

FOREIGN PATENT DOCUMENTS

| JP | 2010-267242 | 11/2010 |
| KR | 10-2005-0101587 A | 10/2005 |

*Primary Examiner* — Dung Van Nguyen
(74) *Attorney, Agent, or Firm* — Lee & Morse, P.C.

(57) ABSTRACT

A method for fabricating a semiconductor device includes obtaining first raw data by measuring an overlay of a semiconductor wafer of a first lot and generating a regression equation based on the first raw data. A semiconductor wafer of a second lot is aligned based on a coefficient of the regression equation, second raw data is obtained by measuring an overlay of the aligned semiconductor wafer of the second lot, and the regression equation is corrected based on the second raw data. Correction of the regression equation includes dividing the regression equation into an initial equation and a residual equation excluding the initial equation from the regression equation, correcting a coefficient of the initial equation; and correcting a coefficient of the residual equation.

18 Claims, 30 Drawing Sheets

(56) References Cited

U.S. PATENT DOCUMENTS

| | | | |
|---|---|---|---|
| 2009/0306807 A1* | 12/2009 | Song | H01L 22/20 700/121 |
| 2011/0207247 A1 | 8/2011 | Hwang | |
| 2011/0276170 A1* | 11/2011 | Baseman | G01R 31/2894 700/110 |
| 2015/0227654 A1* | 8/2015 | Hunsche | G06F 17/5009 716/54 |
| 2015/0356233 A1* | 12/2015 | Fouquet | G06F 17/5081 438/5 |

* cited by examiner

FIG. 12

|  | Normal Regression | | | | SBS Regression | | | |
| --- | --- | --- | --- | --- | --- | --- | --- | --- |
|  | #1 | #2 | #3 | #4 | #1 | #2 | #3 | #4 |
| WK1 | -1.140827792 | -0.753265765 | -1.812700731 | 0.05246152 | -1.033284571 | -0.665999959 | -1.720867045 | 0.120527495 |
| WK3 | 2.41251E-05 | 3.66655E-05 | 5.06058E-05 | 4.98674E-06 | -5.31242E-05 | -2.05167E-05 | -1.28405E-05 | -4.77286E-05 |
| WK5 | -3.5962E-06 | -1.55438E-05 | -9.02362E-06 | 2.98825E-06 | 2.19361E-06 | -6.25705E-06 | -1.9789E-06 | 3.46418E-06 |
| WK7 | 6.51459E-11 | -4.57594E-11 | 5.17631E-11 | 1.46059E-10 | 3.77328E-11 | -6.67103E-11 | 2.89465E-11 | 1.2781E-10 |
| WK9 | -3.97521E-11 | -2.11527E-10 | -5.16767E-11 | -6.84028E-11 | -1.5462E-11 | -1.92446E-10 | -3.12225E-11 | -5.25926E-11 |
| WK11 | 1.08974E-10 | 6.56872E-12 | 7.13118E-12 | 1.44952E-10 | 9.82998E-11 | -3.38065E-12 | -2.57322E-12 | 1.39091E-10 |
| WK13 | -6.15582E-15 | -4.32346E-15 | -5.01374E-15 | -4.27648E-15 | 1.68925E-17 | 2.4583E-16 | 5.60571E-17 | -6.42262E-17 |
| WK15 | -1.94974E-17 | 1.65523E-16 | 4.56422E-16 | 1.04132E-15 | -4.53489E-16 | -5.38026E-16 | -7.50378E-17 | 1.01081E-15 |
| WK17 | -8.7116E-15 | -7.13801E-15 | -7.28751E-15 | -5.88589E-15 | -2.90109E-15 | -2.83668E-15 | -2.51512E-15 | -1.92092E-15 |
| WK19 | 7.33626E-16 | 1.06581E-15 | 6.7494E-16 | -2.10386E-16 | 2.72281E-16 | 3.30533E-16 | 1.15758E-16 | -2.51584E-16 |

METHOD AND APPARATUS FOR FABRICATING SEMICONDUCTOR DEVICE

CROSS-REFERENCE TO RELATED APPLICATION

Korean Patent Application No. 10-2014-0083728, filed on Jul. 4, 2014, and entitled, "Method and Apparatus for Fabricating Semiconductor Device," is incorporated by reference herein in its entirety.

BACKGROUND

1. Field

One or more embodiments described herein relate to a method and apparatus for fabricating a semiconductor device.

2. Description of the Related Art

Regression analysis is an area of inferential statistics which analyzes relationships (e.g., causal relationships) among two or more variables. A regression analysis may be performed based on a mathematical functional equation corresponding to changes in variable values. Using this equation, a correlation between the changes may be inferred. The functional equation may be referred to as a regression equation.

According to one technique, a regression equation is used to analyze what relationship exists between a change in a particular variable (e.g., an independent variable or an explanatory variable) and a change in another variable (e.g., a dependent variable) and the change in which variable is the cause and the change in which variable is the resultant phenomenon. A regression analysis is different from a correlation analysis, which simply investigates the closeness of relationships among variables, not the causal relationships among the variables.

To fabricate a semiconductor device, layers may be aligned with each other by measuring an overlay of a semiconductor wafer. A regression analysis using a regression equation may be performed in the alignment process. The precision and accuracy of the regression analysis may be expected to increase as the regression equation includes higher-order terms. However, a high-order regression equation may experience the problem of multicollinearity, which may threaten the reliability of the process of fabricating a semiconductor device.

SUMMARY

In accordance with one embodiment, a method of fabricating a semiconductor device includes obtaining first raw data by measuring an overlay of a semiconductor wafer of a first lot; generating a regression equation based on the first raw data; aligning a semiconductor wafer of a second lot based on a coefficient of the regression equation; obtaining second raw data by measuring an overlay of the aligned semiconductor wafer of the second lot; and correcting the regression equation based on the second raw data, wherein the correcting of the regression equation includes: dividing the regression equation into an initial equation and a residual equation excluding the initial equation from the regression equation; correcting a coefficient of the initial equation by performing a first regression analysis of the initial equation based on the second raw data; and correcting a coefficient of the residual equation by applying the coefficient of the initial equation to the regression equation and performing a second regression analysis of the regression equation having the coefficient of the initial equation.

An order of the initial equation may be smaller than or equal to that of the regression equation. The first raw data may include a coordinate of the semiconductor wafer of the first lot in a first direction and a coordinate of the semiconductor wafer of the first lot in a second direction intersecting the first direction. Variables of the regression equation may be include one or more of a coordinate in the first direction, a coordinate in a second direction, powers of the coordinates in the first direction and the second direction, and a product of the coordinate in the first direction and the coordinate in the second direction.

The method may include aligning a semiconductor wafer of a third lot based on the coefficient of the corrected regression equation. The regression equation may have a third or higher order. Performing the second regression analysis may include dividing the residual equation into a first residual equation of an order smaller than or equal to that of the residual equation and a second residual equation excluding the first residual equation from the residual equation; correcting a coefficient of the first residual equation by performing a third regression analysis of the first residual equation based on the second raw data; and correcting a coefficient of the second residual equation by performing a fourth regression analysis of the second residual equation based on the second raw data.

The order of the initial equation may be greater than or equal to that of the residual equation. Dividing the regression equation may be include determining whether to divide the regression equation by measuring variation inflation factor (VIF) values of the variables of the regression equation.

Determining whether to divide the regression equation may include performing a regression analysis of the regression equation as a whole without dividing the regression equation if a maximum value among the VIF values is less than a preset first value, dividing the regression equation into the initial equation and the residual equation if the maximum value among the VIF values is equal to or greater than the first value, and performing the first regression analysis and the second regression analysis.

Determining whether to divide the regression equation may include performing a regression analysis of the regression equation as a whole without dividing the regression equation if the maximum value among the VIF values is less than the preset first value, dividing the regression equation into the initial equation and the residual equation if the maximum value among the VIF values is equal to or greater than the first value or if an average value of the VIF values is equal to or greater than a preset second value, and performing the first regression analysis and the second regression analysis.

The regression equation may include a first regression equation and a second regression equation, and aligning the semiconductor wafer of the second lot includes: aligning a coordinate of the semiconductor wafer of the second lot in the first direction using the first regression equation, and aligning a coordinate of the semiconductor wafer of the second lot in the second direction, which intersects the first direction, using the second regression equation. The order of the initial equation may be equal to a lowest order among orders of terms of the regression equation.

In accordance with another embodiment, a method for performing a step-by-step (SBS) regression analysis used by a coefficient provider, the method comprising: providing a regression equation based on the following equation:

$$Z_x = \sum_{i=0}^{n} \sum_{j=0}^{m} k_{ij} x^i y^j$$

where i, j, n, and m are integers of 0 or more, $k_{ij}$ is a real number, $0 \le i$, and $j \le 1$; determining a coefficient of an initial equation by performing a first regression analysis of the initial equation, which includes a constant and a first-order term of the regression equation, using raw data; determining a coefficient of a residual equation excluding the initial equation from the regression equation by performing a second regression analysis of the residual equation using the raw data; correcting the regression equation using the determined coefficients; and outputting information including the corrected regression equation to align a semiconductor wafer and a reticle for a light exposure operation. The parameter x is a coordinate of a semiconductor wafer of a first lot in a first direction, and the parameter y is a coordinate of the semiconductor wafer of the first lot in a second direction intersecting the first direction.

In accordance with another embodiment, an apparatus for fabricating a semiconductor device includes an input to receive first raw data based on an overlay measurement of a semiconductor wafer of a first lot; a processor to perform operations including: a) generating a regression equation based on the first raw data; b) aligning a semiconductor wafer of a second lot based on a coefficient of the regression equation; c) obtaining second raw data by measuring an overlay of the aligned semiconductor wafer of the second lot; and d) correcting the regression equation based on the second raw data; and an output to output information including the corrected regression equation to perform a semiconductor alignment operation prior to light exposure, wherein the processor is to correct the regression equation by: dividing the regression equation into an initial equation and a residual equation excluding the initial equation from the regression equation; correcting a coefficient of the initial equation by performing a first regression analysis of the initial equation based on the second raw data; and correcting a coefficient of the residual equation by applying the coefficient of the initial equation to the regression equation and performing a second regression analysis of the regression equation having the coefficient of the initial equation.

An order of the initial equation may be smaller than or equal to that of the regression equation. The first raw data may include a coordinate of the semiconductor wafer of the first lot in a first direction and a coordinate of the semiconductor wafer of the first lot in a second direction intersecting the first direction. Variables of the regression equation may include one or more of a coordinate in the first direction, a coordinate in a second direction, powers of the coordinates in the first direction and the second direction, and a product of the coordinate in the first direction and the coordinate in the second direction.

Performing the second regression analysis may include dividing the residual equation into a first residual equation of an order smaller than or equal to that of the residual equation and a second residual equation excluding the first residual equation from the residual equation; correcting a coefficient of the first residual equation by performing a third regression analysis of the first residual equation based on the second raw data; and correcting a coefficient of the second residual equation by performing a fourth regression analysis of the second residual equation based on the second raw data.

BRIEF DESCRIPTION OF THE DRAWINGS

Features will become apparent to those of skill in the art by describing in detail exemplary embodiments with reference to the attached drawings in which:

FIG. 12 illustrates a comparison of the results of performing a normal regression and a step-by-step (SBS) regression;

DETAILED DESCRIPTION

Figure 1:
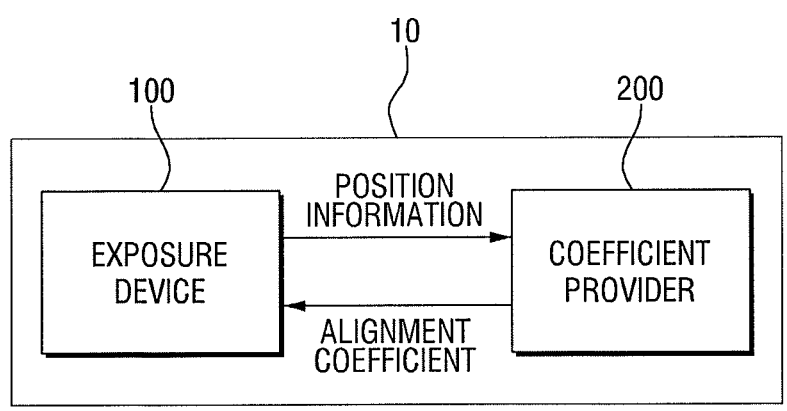
FIG. 1 illustrates an embodiment of an apparatus for fabricating a semiconductor device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the dimensions of layers and regions may be exaggerated for clarity of illustration. It will also be understood that when a layer or element is referred to as being "on" another layer or substrate, it may be directly on the other layer or substrate, or intervening layers may also be present. Further, it will be understood that when a layer is referred to as being "under" another layer, it may be directly under, and one or more intervening layers may also be present. In addition, it will also be understood that when a layer is referred to as being "between" two layers, it may be the only layer between the two layers, or one or more intervening layers may also be present. Like reference numerals refer to like elements throughout.

FIG. 1 illustrates an embodiment of an apparatus 10 for fabricating a semiconductor device. Referring to FIG. 1, the apparatus 10 includes an exposure device 100 and a first coefficient provider 200.

The exposure device 100 may perform a photo process for patterning a semiconductor wafer. For example, the exposure device 100 may measure an overlay of a semiconductor wafer and an overlay of a reticle of the semiconductor wafer, and may generate position information by measuring the overlay of the semiconductor wafer and the overlay of the reticle of the semiconductor wafer. The position information may be transmitted to the first coefficient provider 200, which may transmit an alignment coefficient back to the exposure device 100. The exposure device 100 may then align the semiconductor wafer and the reticle of the semiconductor wafer, and expose the semiconductor wafer to light.

The exposure device 100 may not always perform both the exposure function and the measurement function. For example, in one embodiment, the exposure device 100 may only perform the exposure function, and another module may perform the measurement function. Alternatively, the exposure device 100 and the first coefficient provider 200 may be included in one module. For example, the measurement, exposure and coefficient providing functions may be performed by different modules or by one module. Alternatively, only a module that performs at least one of the above functions may be provided as a separate module.

Semiconductor wafers may be sequentially provided to the exposure device 100 and thus exposed to light. The semiconductor wafers may be provided, for example, in lots. A lot may be a set of one or more semiconductor wafers. For example, the exposure device 100 exposes each lot of one or more semiconductor wafers to light and generates position information. The first coefficient provider 200 may perform a regression analysis using the position information generated for each lot as raw data.

The first coefficient provider 200 may receive the position information or the raw data from the exposure device 100. The first coefficient provider 200 may generate a regression equation for the arrangement of dies defined by the semiconductor wafer and the semiconductor reticle using the position information, and may correct a coefficient of the regression equation through a regression analysis. The first coefficient provider 200 may provide the corrected coefficient (e.g., the alignment coefficient) of the regression equation to the exposure device 100.

Figure 2:
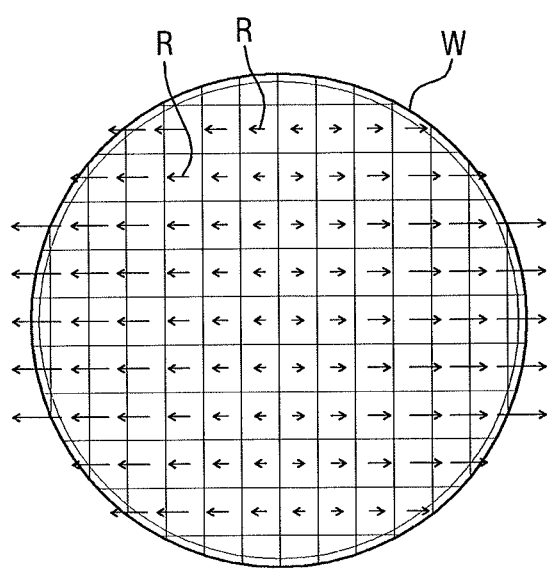
FIG. 2 illustrates an example of a semiconductor wafer.

FIG. 2 illustrates an example of a semiconductor wafer W for explaining an overlay of the semiconductor wafer W measured by the apparatus 10 of FIG. 1. Referring to FIG. 2, the semiconductor wafer W includes a plurality of dies R defined according to reticle coordinates. The semiconductor wafer W may have wafer coordinates. The wafer coordinates may have a coordinate in a first direction and a coordinate in a second direction intersecting the first direction. A position in a plane may be defined using the coordinates in the first and second directions.

The semiconductor wafer W includes a plurality of dies R. Each of the dies R may have reticle coordinates. For example, the dies R may have different coordinates within the same semiconductor wafer W. The reticle coordinates may have a coordinate in the first direction and a coordinate in the second direction intersecting the first direction. A position in a plane may be defined using the coordinates in the first and second directions.

Each arrow in FIG. 2 indicates the degree of misalignment of each die R. For example, each die R of the semiconductor wafer W may have a similar misalignment tendency as an adjacent die R, and the misalignment tendency of each die R may be continuous to that of the adjacent die R. However, the dies R may basically have different misalignment.

The exposure device 100 may generate position information by measuring coordinates of each die R and the degree of misalignment of each die R. Then, the exposure device 100 may provide the generated position information to the first coefficient provider 200.

Figure 3:
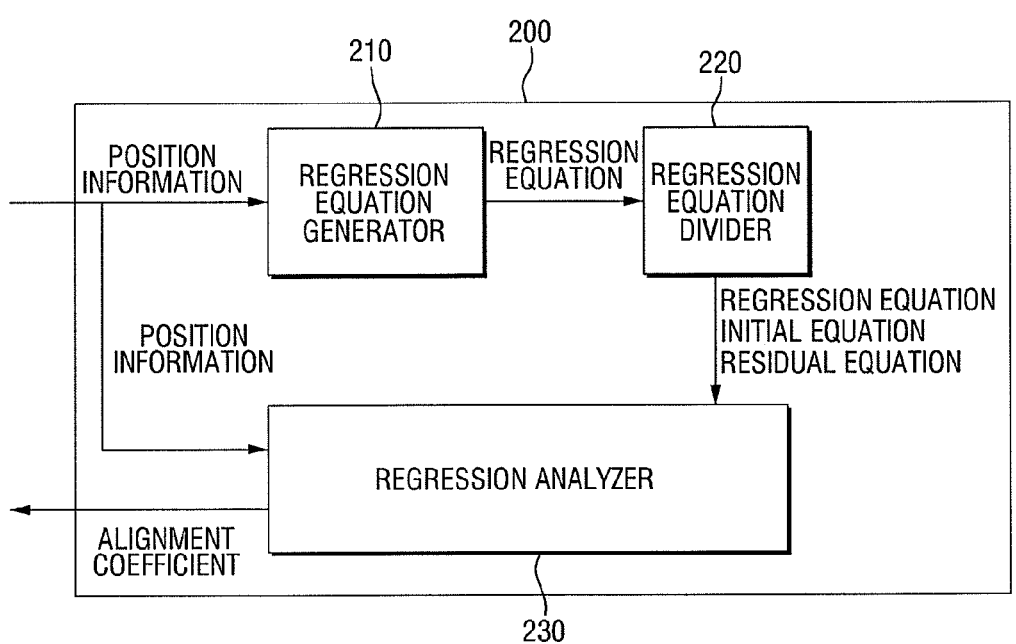
FIG. 3 illustrates an embodiment of a first coefficient provider.

FIG. 3 illustrates an embodiment of the first coefficient provider 200 in the apparatus 10 of FIG. 1. The first coefficient provider 200 includes a regression equation generator 210, a regression equation divider 220, and a regression analyzer 230.

The regression equation generator 210 may receive position information from the exposure device 100. The position information may be first raw data. The first raw data may be position information of at least one semiconductor wafer of a first lot. The regression equation generator 210 may receive the position information and generate a regression equation:

$$Z_x = \sum_{i=0}^{n} \sum_{j=0}^{m} k_{ij} x^i y^j \qquad (1)$$

where i, j, n and m are integers greater than zero, $k_{ij}$ is a real number, x is a variable as a coordinate in the first direction, y is a variable as a coordinate in the second direction, and $Z_x$ is a measure of the degree of misalignment in the first direction.

The regression equation may be expressed as Equation (1) As the values of n and m increase, the order of the regression equation increases, thus making a more precise regression analysis possible. The regression equation may be generated using a parameter $Z_y$ (which is in the same form as $Z_x$ and indicates the degree of misalignment in the second direction) as a dependent variable and using x, y, powers of x and y, and a product of x and y as variables. In the above regression equation, the value of $k_{ij}$ is gradually corrected to make precise overlay alignment possible.

The first direction and the second direction may be perpendicular to each other. In another embodiment, the first direction and the second direction may be different directions that are not parallel to each other. The regression equation may be a third or higher order equation. More precise correction may be possible as the order of the regression equation is increases.

Figure 4:
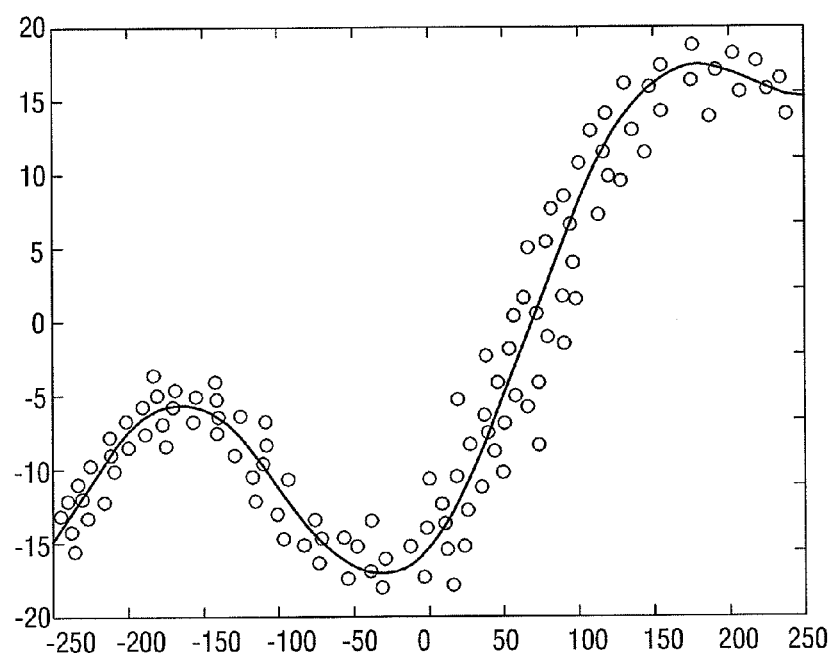
FIG. 4 illustrates an embodiment of a method for generating a regression equation.

FIG. 4 is a graph illustrating an embodiment of a method for generating a regression equation based on raw data by using the apparatus 10 of FIG. 1. Referring to FIG. 4, a regression equation of a graph illustrating a trend of the first raw data may be generated. For example, each circle in FIG.

4 indicates raw data, and a graph illustrating the trend of the raw data is a regression equation generated by the regression equation generator 210.

Also, in FIG. 4, the horizontal axis represents the coordinate in the first direction of a semiconductor wafer, and the vertical axis represents the misalignment parameter in the first direction. Whenever data is accumulated, a regression analysis may be performed to correct the regression equation, e.g., so that the regression equation has a more similar trend line as the data. Thus, a semiconductor device with high reliability may be fabricated using a precise semiconductor fabrication process.

As mentioned above, as the values of n and m increase, the order of the regression equation increases, thus making a more precise regression analysis possible. However, the increased order of the regression equation may cause the problem of multicollinearity. For example, in regression analysis, highly correlated independent variables cause a determinant of a variance/covariance matrix to have a value close to zero, thus significantly reducing the estimation accuracy of a regression coefficient. This phenomenon is referred to as multicollinearity or collinearity.

Figure 5:
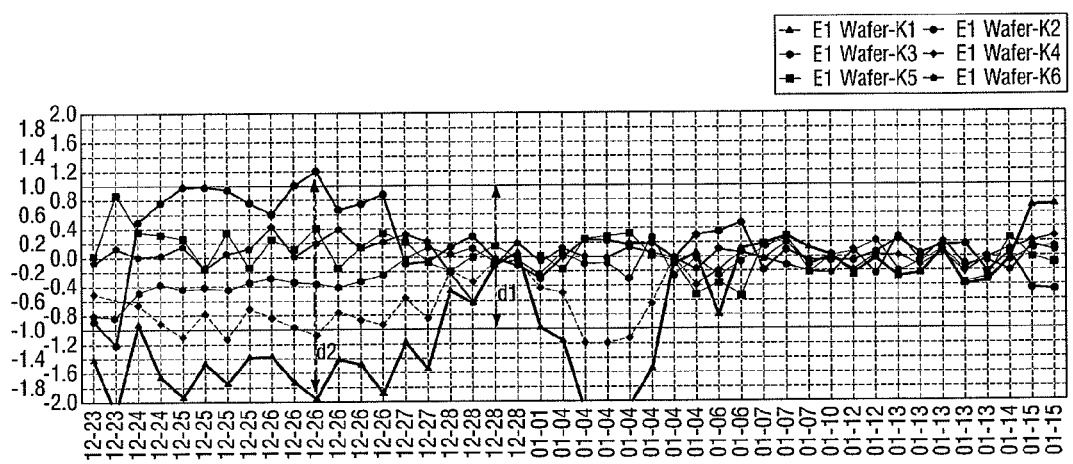
FIG. 5 illustrates an example of a misalignment parameter measured by the apparatus of FIG. 1 for semiconductor wafers.

FIG. 5 is a graph illustrating an example of a misalignment parameter in the first direction measured by the apparatus 10 of FIG. 1 for each lot of semiconductor wafers. Referring to FIG. 5, the vertical axis represents the misalignment parameter in the first direction, and the horizontal axis represents each lot of semiconductor wafers. The graph in FIG. 5 represents a coefficient of each variable in a regression equation.

Through regression analysis, the misalignment parameter in the first direction for each lot should have certain directionality because raw data for a number of lots are sequentially applied to the misalignment parameter. Through this, more precise correction may be performed using the immediately previous result. Therefore, if an immediately previous value varies sharply, the reliability of correction based on this value may be reduced. Such a variation is mostly caused by multicollinearity.

The curves in FIG. 5 generally exist within a range of d1. However, they sometimes exist within a range of d2 beyond the range of d1, because variables having the range of d2 are multi-collinear. Therefore, the precision of regression analysis may be reduced unless the problem of multicollinearity is solved. This explains a desire for a process for fabricating a semiconductor device having high reliability and consistency by solving the problem of multicollinearity.

Figure 6:
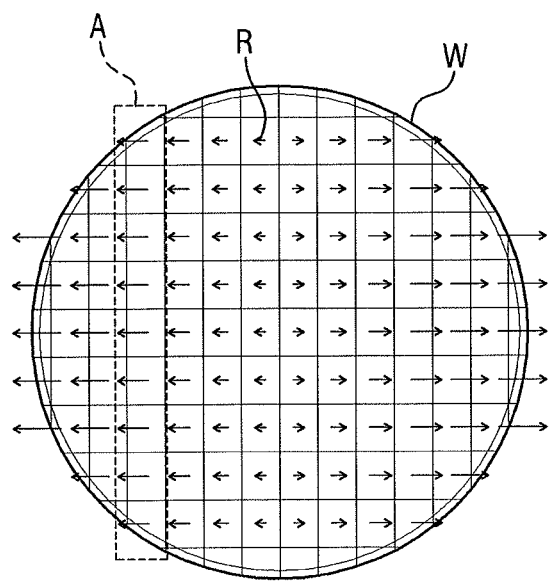
FIG. 6 illustrates a comparison of semiconductor wafers to explain the misalignment parameter of a semiconductor wafer according to a coefficient with multicollinearity.
Figure 6:
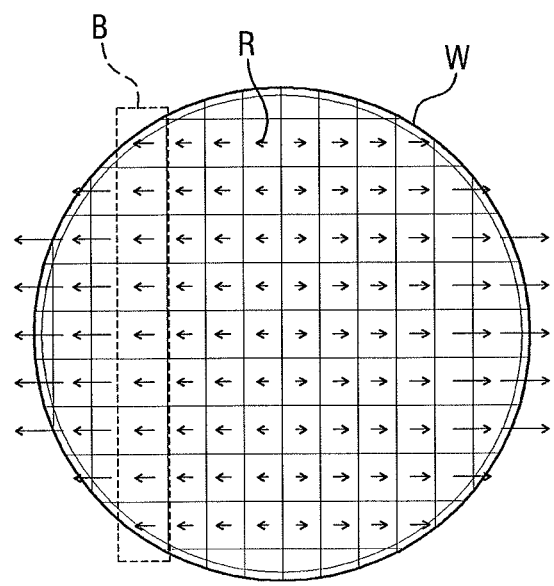
Figure 7:
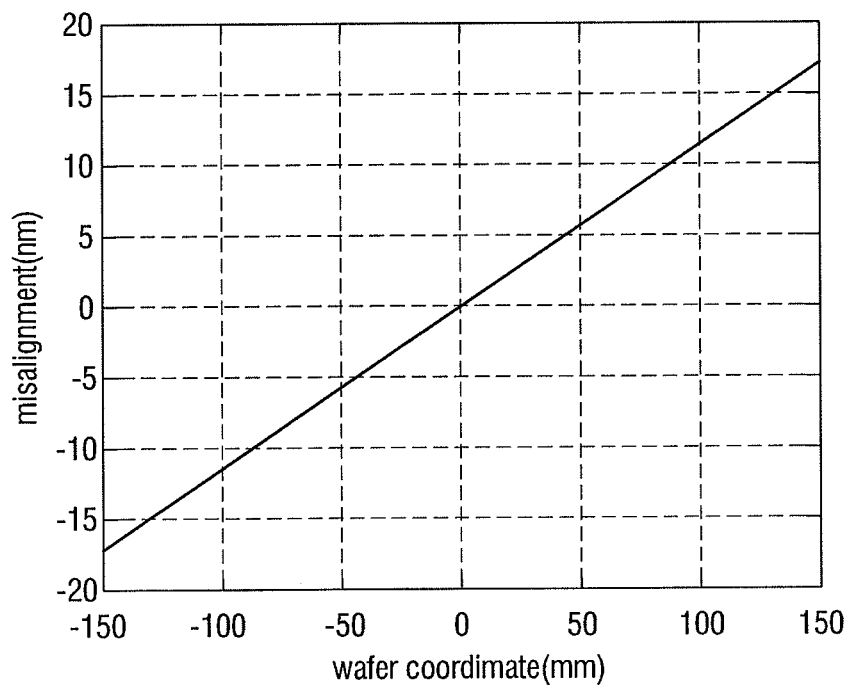
FIG. 7 illustrates graphs for regression equations composed of variables corresponding to the semiconductor wafers of FIG. 6.
Figure 7:
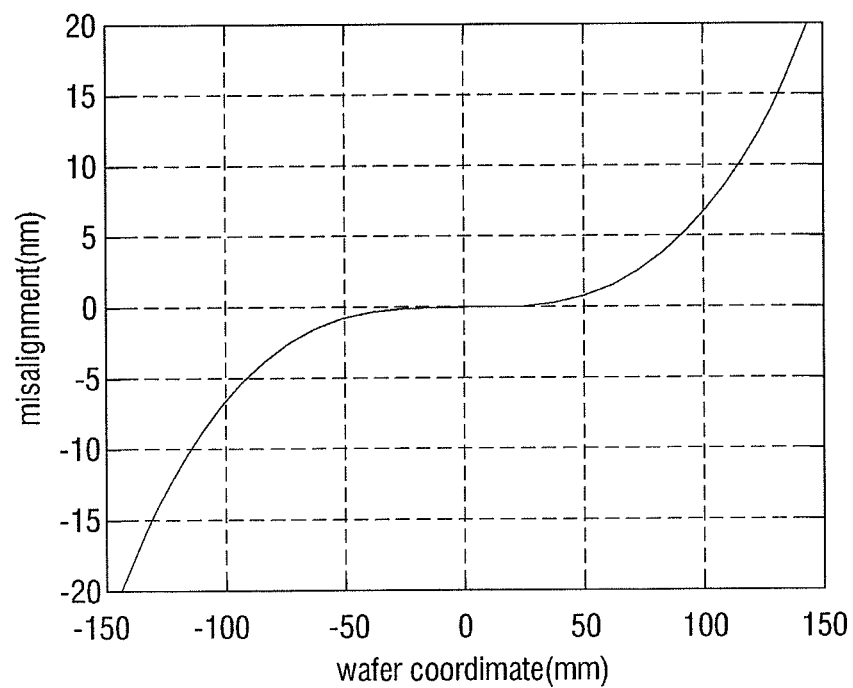
Figure 8:
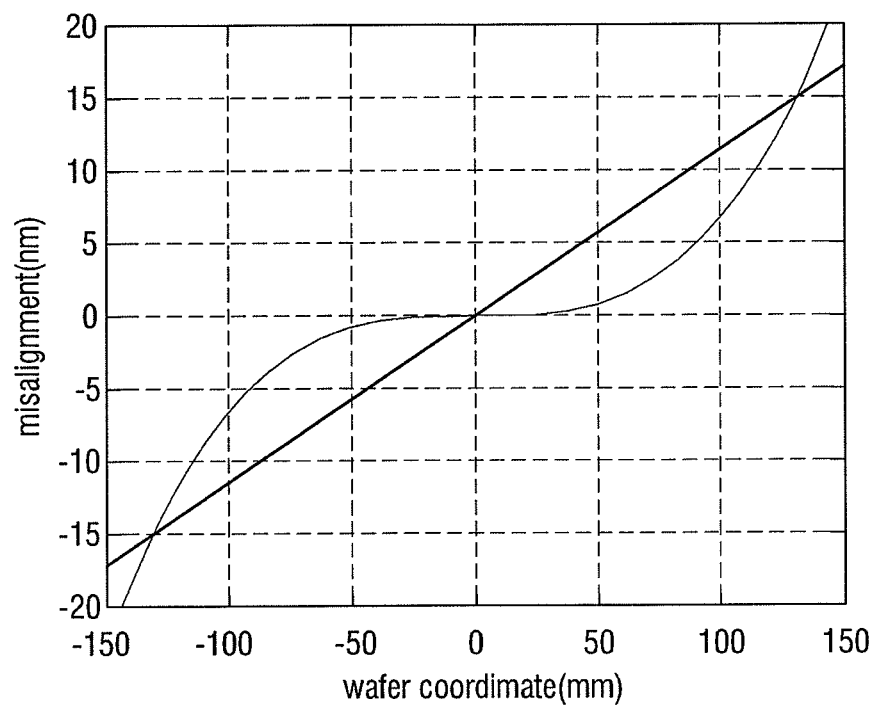
FIG. 8 illustrates a combined version of the two graphs of FIG. 7 to determine similarity between the graphs of FIG. 7.

FIG. 6 illustrates a comparison of semiconductor wafers to explain the misalignment parameter of a semiconductor wafer according to a coefficient with multicollinearity. FIG. 7 illustrates curves representing regression equations composed of variables which correspond to the semiconductor wafers of FIG. 6. FIG. 8 combines the curves FIG. 7 to provide an indication of similarity between these curves.

Referring to FIG. 6, each arrow in an upper semiconductor wafer represents the degree of misalignment of an equation ($k_{10}$ x) of the misalignment parameter according to a coefficient of the variable x in the first direction in Equation (1). In addition, each arrow in a lower semiconductor wafer represents the degree of misalignment of an equation ($k_{30}$ $x^3$) of the misalignment parameter according to a coefficient of the cube $x^3$ of the variable x in the first direction in Equation (1).

The arrows of both wafers are almost similar but slightly different in regions A and B. Variables (such as x and $x^3$) having similar tendencies may greatly damage the precision of a regression analysis because they interfere with each other and, in at least some cases, should be independent from each other.

Referring to FIGS. 7 and 8, an upper graph represents the equation ($k_{10}$ x) of the misalignment parameter according to the coefficient of the variable x in the first direction in Equation (1). The lower graph represents the equation ($k_{30}$ $x^3$) of the misalignment parameter according to the coefficient of the cube $x^3$ of the variable x in the first direction in Equation (1). FIG. 8 compares the graphs of both equations.

Referring to FIG. 8, both equations are slightly different but are not greatly different from each other. Therefore, a value that should be corrected by the equation ($k_{10}$ x) may sometimes be corrected by the equation ($k_{30}$ $x^3$). For example, since a regression analysis should follow a trend most closely with raw data, a value of $k_{10}$ and a value of $k_{30}$ may interfere with each other. Thus, the value of $k_{10}$ may lose consistency and directionality such as one of the graphs that form the range of d2 among the graphs of FIG. 5.

In principle, a great part of the regression equation should be corrected by a low-order term. The remaining part of the regression equation should be fine-corrected by a high-order term (e.g., a power). Therefore, the high-order term should be a contributing element to fine correction. However, a high-order element may undermine the consistency of a low-order element due to multicollinearity. In accordance with one embodiment, a method is provided which solves the problem of multicollinearity.

Referring back to FIG. 3, the regression equation divider 220 may divide the regression equation into an initial equation and a residual equation. The order of the initial equation may be lower than or equal to that of the regression equation. The initial equation and the residual equation, into which the regression equation is divided by the regression equation divider 220, may be combined back into the regression equation.

As the regression equation divider 220 divides the regression equation into the initial equation and the residual equation, the problem of multicollinearity or collinearity may be solved. This is because a regression analysis is performed on a coefficient of each multi-collinear variable separately. For this effect, multi-collinear variables should be separated from each other by the division of the regression equation into the initial equation and the residual equation.

As described above, collinearity is a problem among variables with similar tendencies. Therefore, collinearity is more likely to occur when the variables have different orders than when they have the same order. For this reason, the regression equation may be divided into the initial equation and the residual equation having different orders. In one embodiment, the order of the initial equation may be equal to a lowest order among orders of the regression equation. This is because a variable of the lowest order and a variable of an odd power thereof are likely to have collinearity. In another embodiment, the order of the initial equation may be different from the lowest order among orders of the regression equation.

The regression equation divider 220 may transmit the regression equation, the initial equation, and the residual equation to the regression analyzer 230. Because the regression equation is the sum of the initial equation and the residual equation, it may not be transmitted.

The regression analyzer 230 may receive the initial equation and the residual equation from the regression equation divider 220. The regression analyzer 230 may also receive position information from the exposure device 100. The position information may be second raw data of a second lot which is different from the first raw data of the first lot. For example, the regression analyzer 230 may receive new position information, not the first raw data used by the regression equation generator 210, to generate the existing regression equation.

The regression analyzer 230 may correct the regression equation generated by the regression equation generator 210 using the second raw data. For example, the regression analyzer 230 may correct a coefficient of each variable of the regression equation.

The regression analyzer 230 may perform a first regression analysis of the initial equation. Since a variable of the residual equation having the problem of collinearity with a variable of the initial equation has been separated in advance from the variable of the initial equation, a coefficient of the initial equation may be corrected without the problem of multicollinearity.

After correcting the coefficient of the initial equation, the regression analyzer 230 may perform a second regression analysis of the residual equation excluding the initial equation having the corrected coefficient from the regression equation. Since the variable of the initial equation having the problem of multicollinearity with the variable of the residual equation has been separated in advance from the variable of the residual equation, a precise regression analysis may be performed immediately without the problem of collinearity.

The regression analyzer 230 may generate a coefficient (e.g., an alignment coefficient) of the regression equation through the above two regression analyses, and may provide the generated coefficient to the exposure device 100. The exposure device 100 may align the position of a semiconductor wafer of a new third lot based on the received alignment coefficient, measure an overlay of the semiconductor wafer of the third lot, and provide new position information, that is, third raw data. The regression equation generator 210, which has already received the alignment coefficient and corrected the regression equation, may recorrect the regression equation. Then, the regression equation divider 220 and the regression analyzer 230 may correct the corrected regression equation again using the third raw data. In this way, a regression analysis may be repeatedly performed whenever a new semiconductor wafer is provided to the exposure device 100.

In accordance with the present embodiment, the apparatus 10 for fabricating a semiconductor device may, in at least some instances, perfectly remove the problem of collinearity by performing a step-by-step regression analysis of a regression equation that may have the problem of collinearity. In the case of a regression equation without the problem of collinearity, the apparatus 10 may increase precision by increasing the order of the regression equation to a higher order.

Figure 9:
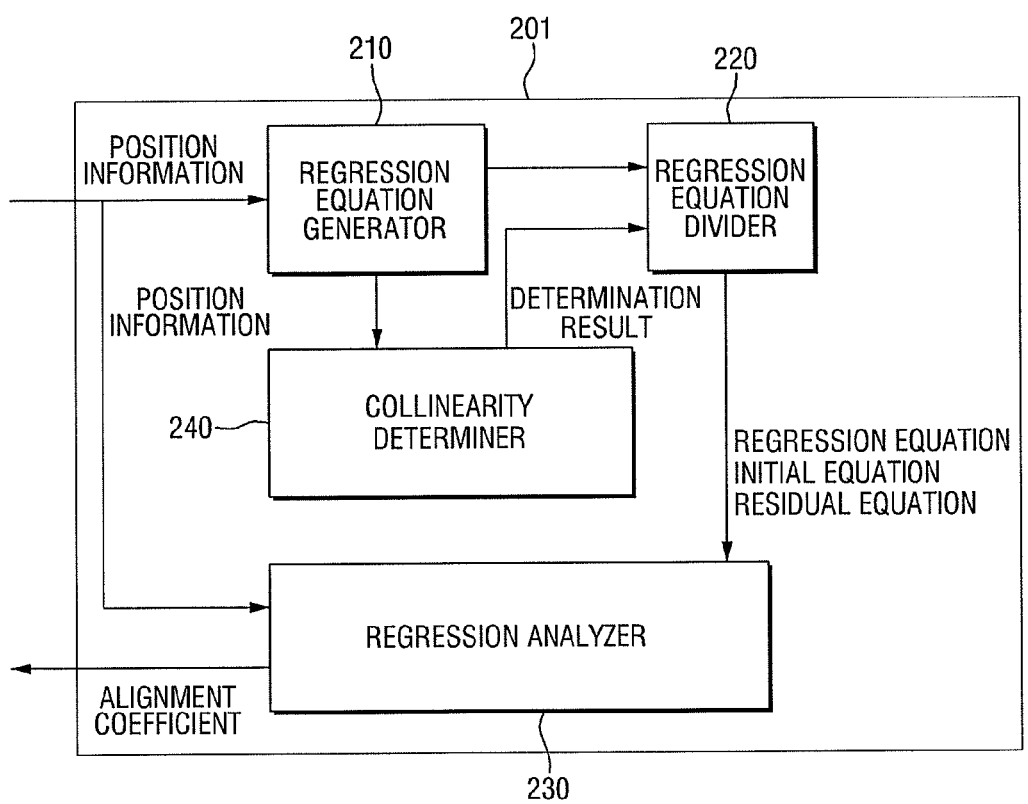
FIG. 9 illustrates an embodiment of a second coefficient provider.

FIG. 9 illustrates an embodiment of a second coefficient provider 201 in an apparatus for fabricating a semiconductor device. Referring to FIG. 9, the second coefficient provider 201 includes a collinearity determiner 240 in addition to the elements of the first coefficient provider 200.

The collinearity determiner 240 may receive a regression equation from a regression equation generator 210. The collinearity determiner 240 may measure a variation inflation factor (VIF) value of each variable of the regression equation. The VIF value is a parameter having a value of one to infinity and is used to determine the presence of multicollinearity. In one embodiment, a variable having a VIF value of 10 or more may be determined to have multicollinearity. However, the criterion for multicollinearity may not be limited to the above example and may vary depending on the situation.

If the regression equation has n independent variables and one dependent variable, a total number of variables is n+1. All of the data are quantitative variables. A VIF value of each independent variable may be given by Equation (2).

$$VIF_k = \frac{1}{(1 - R_j^2)} \quad (2)$$

where k is an integer of 1 to n, and $VIF_k$ is a VIF value of a $k^{th}$ independent variable. In addition, a value of $R_j^2$ is an R-squared value, e.g., the square of a correlation coefficient (R) obtained by performing a regression analysis by designating the $k^{th}$ independent variable as a dependent variable and the other (n−1) independent variables as independent variables. The independent variable is excluded from this regression analysis because multicollinearity is to measure correlations among input variables.

As the VIF value is closer to one, the degree of multicollinearity is lower. Conversely, as the VIF value is higher, the degree of multicollinearity is higher. Since the VIF value has a range of one to infinity, a reference value based on which the presence of multicollinearity may be determined is desired. In one embodiment, a variable having a VIF value of 10 or more may be determined to have multicollinearity. In another embodiment, a particular reference value may be set.

The collinearity determiner 240 may calculate the VIF value of each variable of the regression equation and determine the presence of collinearity based on the VIF value. For example, the collinearity determiner 240 may determine that the regression equation has collinearity if a maximum VIF value among the measured VIF values is equal to or greater than a preset reference value a. Even when the maximum VIF value is less than the preset reference value a, if an average value of the VIF values is equal to or greater than another reference value b, the collinearity determiner 240 may determine that the regression equation has collinearity.

A regression equation divider 220 may receive the determination result of the collinearity determiner 240. If the collinearity determiner 240 determines that the regression equation has collinearity, the regression equation divider 220 may divide the regression equation into an initial equation and a residual equation. If the collinearity determiner 240 determines that the regression equation does not have collinearity, the regression equation divider 220 may not divide the regression equation into the initial equation and the residual equation. In this case, the regression equation divider 220 may immediately provide the regression equation as a whole to a regression analyzer 230 without dividing the regression equation.

When the regression equation divider 220 divides the regression equation into the initial equation and the residual equation based on the determination result of the collinearity determiner 240 and provides the initial equation and the residual equation to the regression analyzer 230, the regression analyzer 230 may perform a first regression analysis of the initial equation and perform a second regression analysis of the residual equation. However, when the regression equation divider 220 provides the regression equation as a whole to the regression analyzer 230 based on the determination result of the collinearity determiner 240 without dividing the regression equation into the initial equation and the residual equation, the regression analyzer 230 may perform a regression analysis of the regression equation as a whole.

In accordance with the current embodiment, the apparatus for fabricating a semiconductor device determines the presence of collinearity and then determines whether to perform a regression analysis step-by-step. This may reduce the amount of computation required, which, in turn, makes it possible to efficiently fabricate a semiconductor device.

Figure 10:
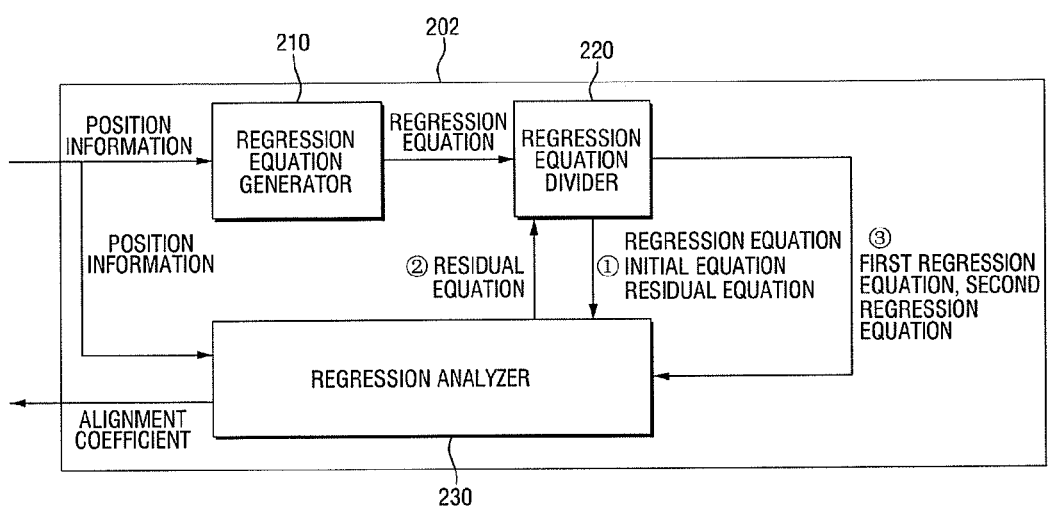
FIG. 10 illustrates an embodiment of a third coefficient provider.

FIG. 10 illustrates an embodiment of a third coefficient provider 202 in an apparatus for fabricating a semiconductor device. Referring to FIG. 10, the third coefficient provider 202 divides a residual equation using a regression equation divider 220 and a regression analyzer 230.

According to the current embodiment, the regression equation divider 220, like the regression divider 220 of the first coefficient provider 200, provides an initial equation and a residual equation to the regression analyzer 230 (step ①). Here, the regression analyzer 230 determines an alignment coefficient of the initial equation by performing a first regression analysis of the initial equation.

The regression analyzer 230 provides the residual equation back to the regression equation divider 220 without immediately performing a second regression analysis of the residual equation (step ②). The residual equation provided here may be a residual equation including the alignment coefficient of the initial equation determined by the first regression analysis.

The regression equation divider 220 may divide the residual equation into a first residual equation and a second residual equation (step ③). The relationship between the first residual equation and the residual equation may be similar to the relationship between the initial equation and a regression equation. The order of the first residual equation may be smaller than or equal to that of the residual equation. The first residual equation and the second residual equation may be combined into the residual equation.

In FIG. 10, the residual equation is divided. In another embodiment, the first residual equation may also be transmitted back to the regression equation divider 220 and then divided. The number of times that the residual equation is divided may be set in advance.

In accordance with the current embodiment, the apparatus for fabricating a semiconductor device may perform a regression analysis step-by-step, and the number of steps may be increased to a desired number, unless other limiting factors are present. Accordingly, the order of the regression equation may be increased to a desired order. For example, the position of a semiconductor wafer may be corrected precisely using a high-order regression equation.

In the past, a high-order regression equation has not been introduced due to the problem of collinearity. However, since the apparatus for fabricating a semiconductor device according to the current embodiment is free from the problem of collinearity, it may use a high-order regression equation and thus perform correction with improved or desired precision.

Figure 11:
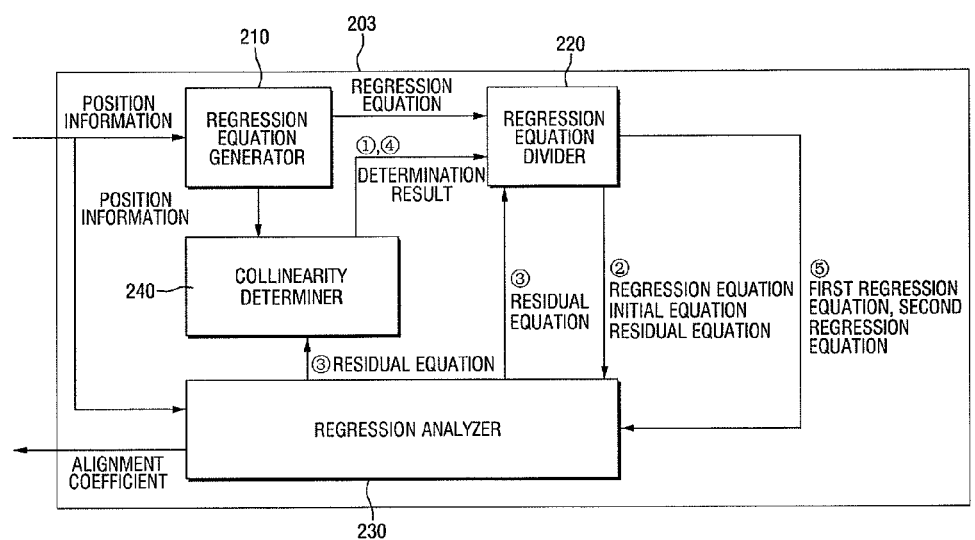
FIG. 11 illustrates an embodiment of a fourth coefficient provider.
Figure 13:
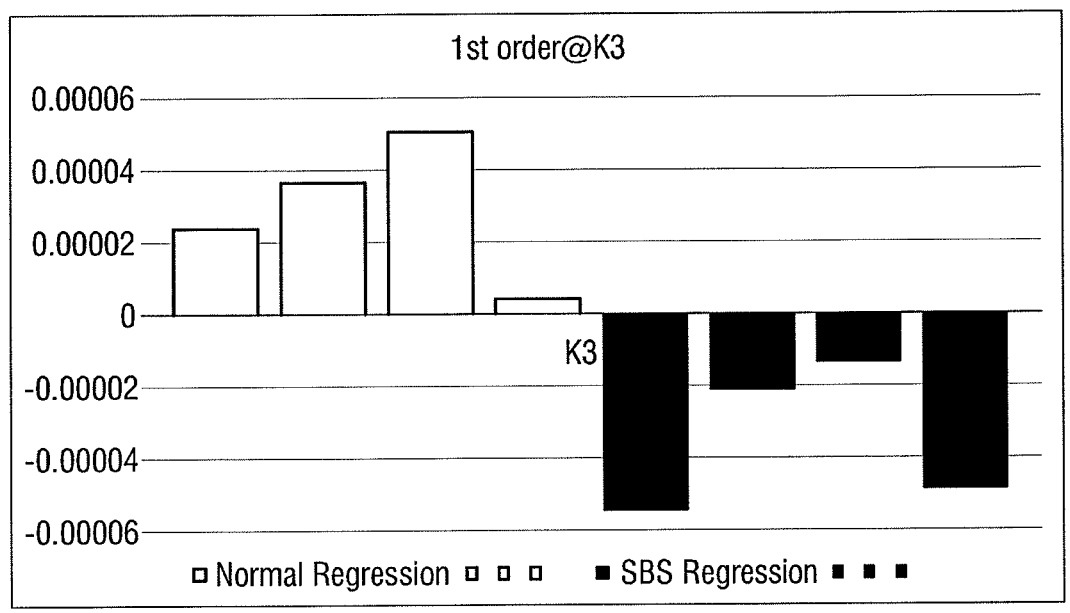
FIGS. 13 to 18 illustrate comparisons of a normal regression and an SBS regression based on the table of FIG. 12.
Figure 14:
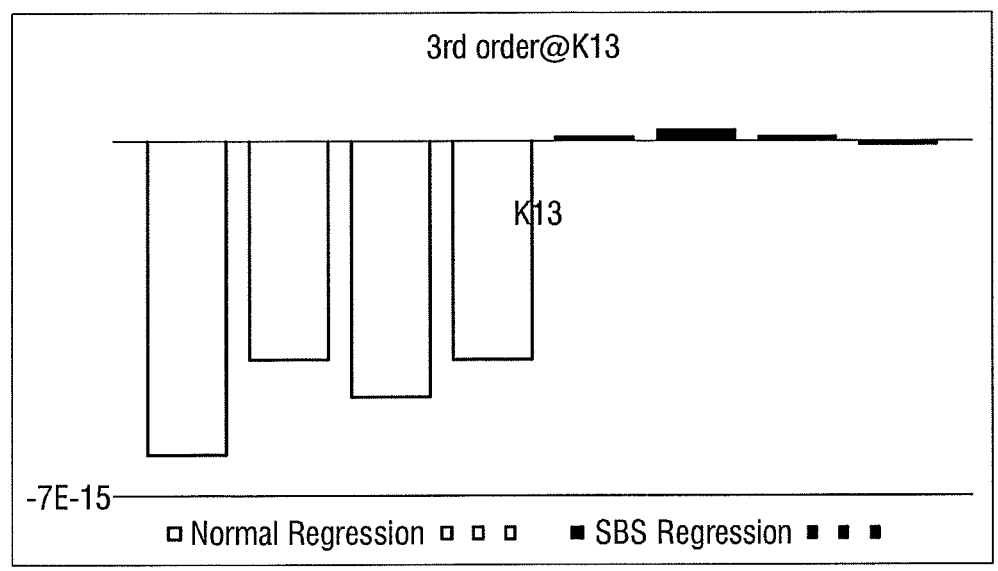

FIG. 11 illustrates an embodiment of a fourth coefficient provider 203 included in an apparatus for fabricating a semiconductor device. Referring to FIG. 11, unlike the third coefficient provider 202, the fourth coefficient provider 203 includes a collinearity determiner 240.

The collinearity determiner 240 receives a regression equation from a regression equation generator 210 and determines whether the regression equation has collinearity (step ①). Based on the determination result of the collinearity determiner 240, a regression equation divider 220 provides the regression equation as a whole to a regression analyzer 230 or divides the regression equation into an initial equation and a residual equation and provides the initial equation and the residual equation to the regression analyzer 230 (step ②). The regression analyzer 230 provides the residual equation to the regression equation divider 220 and the collinearity determiner 240 (step ③). The collinearity determiner 240 determines whether the residual equation has collinearity and transmits the determination result to the regression equation divider 220 (step ④). The regression equation divider 220 may divide the residual equation into a first residual equation and a second residual equation based on the determination result of the collinearity determiner 240 (step ⑤).

Specifically, if the collinearity determiner 240 determines that the residual equation has collinearity, the regression equation divider 220 may divide the residual equation into the first residual equation and the second residual equation and transmit the first residual equation and the second residual equation to the regression analyzer 230. If the collinearity determiner 240 determines that the residual equation does not have collinearity, the regression analyzer 230 may perform a regression analysis of the residual equation as a whole. Here, the determination result of the collinearity determiner 240 may be transmitted to the regression analyzer 230 via the regression equation divider 220 or may be transmitted directly to the regression analyzer 230.

In FIG. 11, the regression equation divider 220 divides the residual equation once. In another embodiment, the second residual equation of the residual equation may also be divided. The number of times the residual equation is divided, that is, the number of times a regression analysis is performed, may be predetermined.

FIG. 12 is a table comparing the results of performing a normal regression and a step-by-step (SBS) regression according to one embodiment using four overlay data. FIGS. 13 to 18 are graphs comparing the normal regression and the SBS regression according to the current embodiment based on the table of FIG. 12.

The table of FIG. 12 compares four times (using four raw data), alignment coefficients (WK1 . . . WK19) of a regression equation in a first direction for the normal regression and the SBS regression according to the current embodiment.

Figure 15:
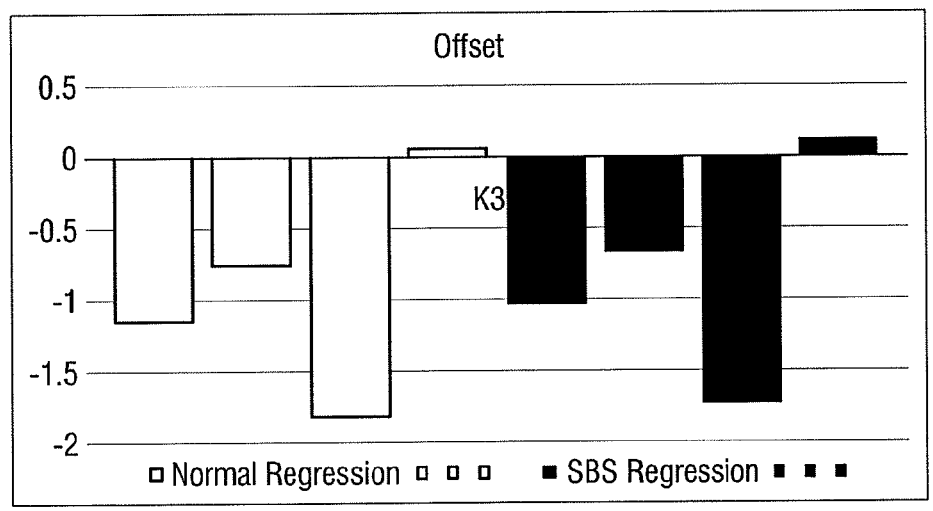
Figure 16:
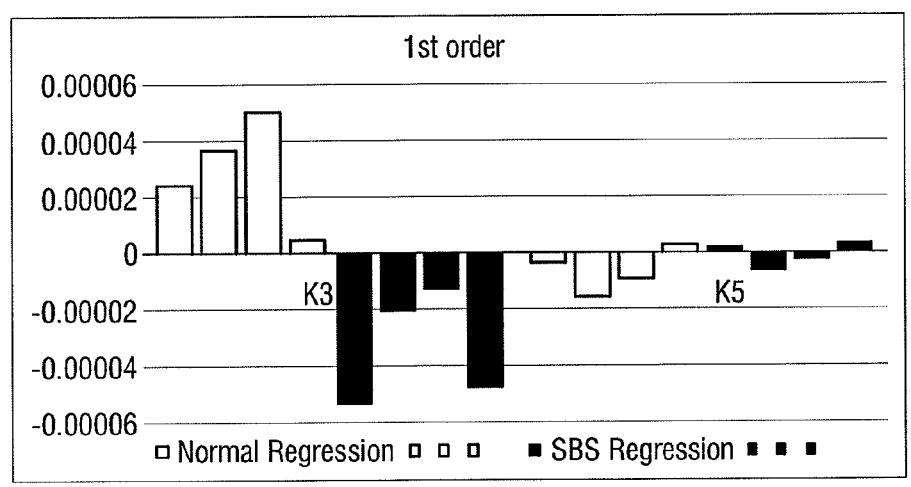
Figure 17:
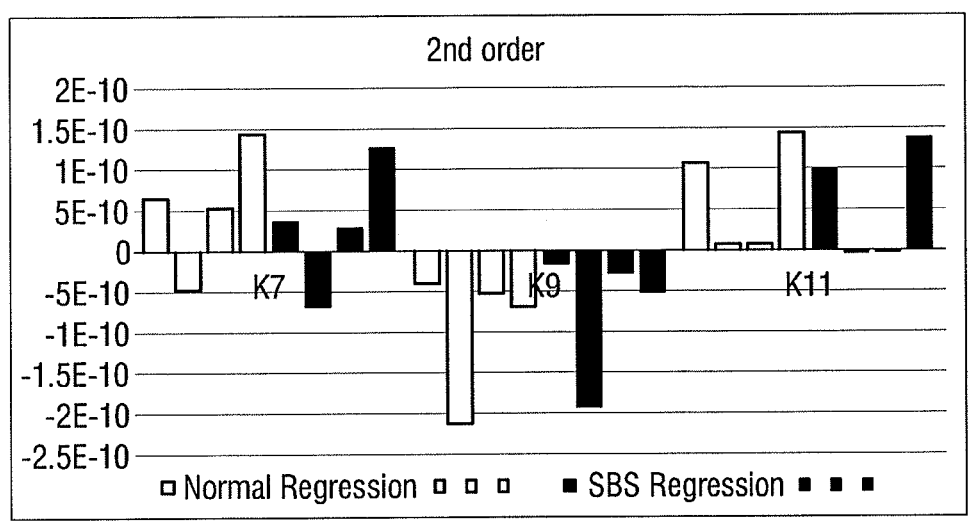
Figure 18:
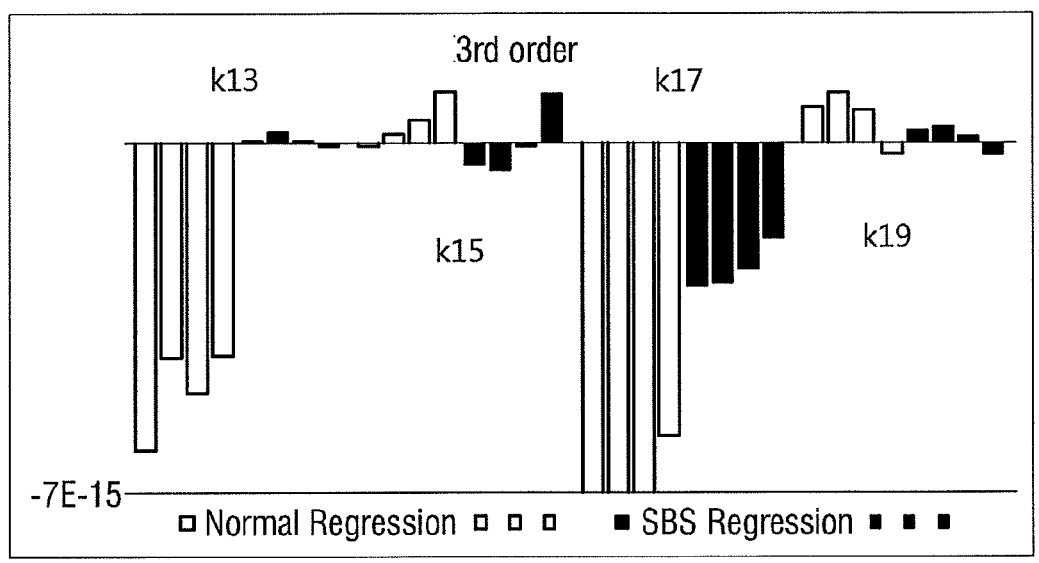

Referring to FIGS. 12 to 18, there is no big difference between the normal regression and the SBS regression according to the current embodiment in the case of coefficients (WK7, WK9 and WK11 of FIG. 12 and k7, k9 and k11 of FIG. 17) of a second-order variable ($x^2$), coefficients (k15, k17 and k19 of FIG. 18 and WK15, WK17 and WK19 of FIG. 12) of a third-order variable ($x^3$), and a constant (WK1 of FIG. 12 and offset of FIG. 15).

However, referring to coefficients k3 and k13 (of FIGS. 13, 14, 16 and 18 and WK3 and WK13 of FIG. 12) of the collinear variables x and $x^3$, it may be understood that k13 of the SBS regression according to the current embodiment has been reduced. For example, the proportion of a high-order term that brings about a relatively large change has been reduced, thereby solving the problem of collinearity. In one embodiment, part of the reduced k13 may be corrected by k3.

Figure 19:
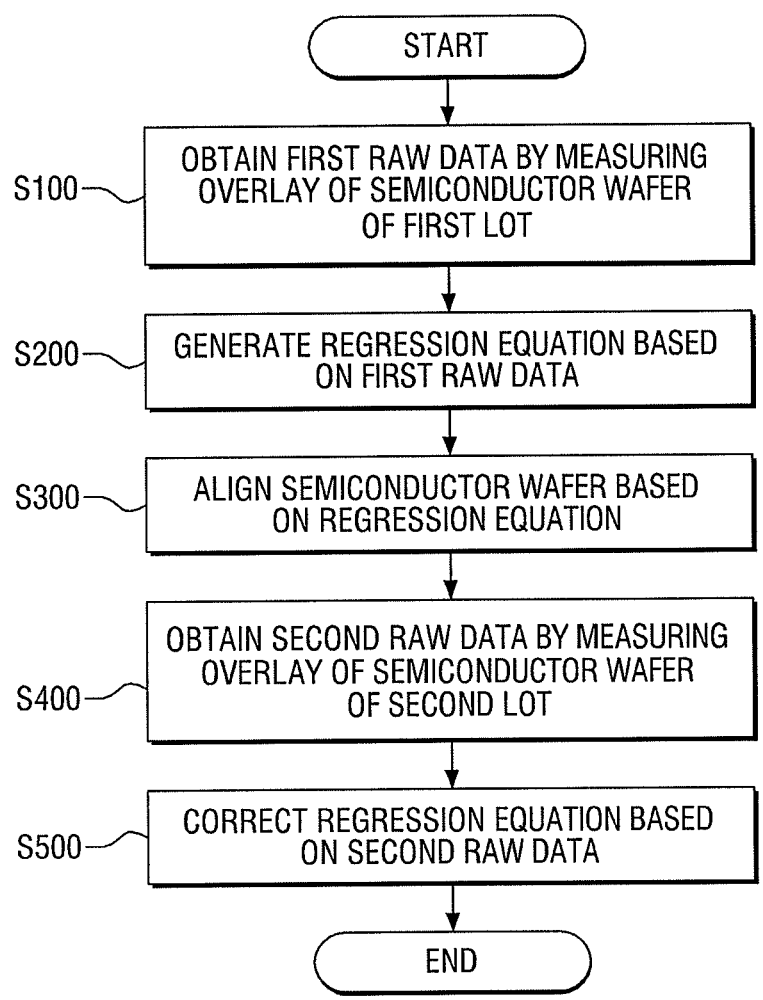
FIG. 19 illustrates an embodiment of a method for fabricating a semiconductor device.

FIG. 19 illustrates an embodiment of a method for fabricating a semiconductor device. Referring to FIGS. 2 and 19, first raw data is obtained by measuring an overlay of a semiconductor wafer of a first lot (operation S100). The first lot may include at least one semiconductor wafer. The overlay of the semiconductor wafer may include wafer coordinates and reticle coordinates. The measuring of the overlay of the semiconductor wafer may be performed by, but not limited to, an exposure device.

Referring to FIGS. 4 and 19, a regression equation is generated based on the first raw data (operation S200). The first raw data may be expressed as a misalignment parameter in a first direction, and a regression equation performing a trend of the first raw data may be generated. The regression equation may have a plurality of orders.

Referring to FIG. 19, a semiconductor wafer of a second lot is aligned based on the regression equation (operation S300). The second lot may include at least one semiconductor wafer. The first and second lots may each include an equal number of semiconductor wafers. The equal number of semiconductor wafers may be the number of semiconductor wafers that may be exposed to light or measured at a time.

The regression equation may be specified by an alignment coefficient, and coordinates of the semiconductor wafer may be determined based on the specified regression equation. Therefore, the semiconductor wafer may be aligned based on the generated regression equation.

Referring to FIGS. 2 and 19, second raw data is obtained by measuring an overlay of the semiconductor device of the second lot (operation S400). The overlay of the aligned semiconductor device of the second lot may be measured. This overlay may be used to correct the regression equation based on the second raw data different from the first raw data.

Referring to FIG. 19, the regression equation is corrected based on the second raw data (operation S500). The correcting of the regression equation may be achieved by performing a regression analysis through a number of steps as will be described below. The correcting of the regression equation based on the second raw data will now be described in detail with reference to FIG. 20.

Figure 20:
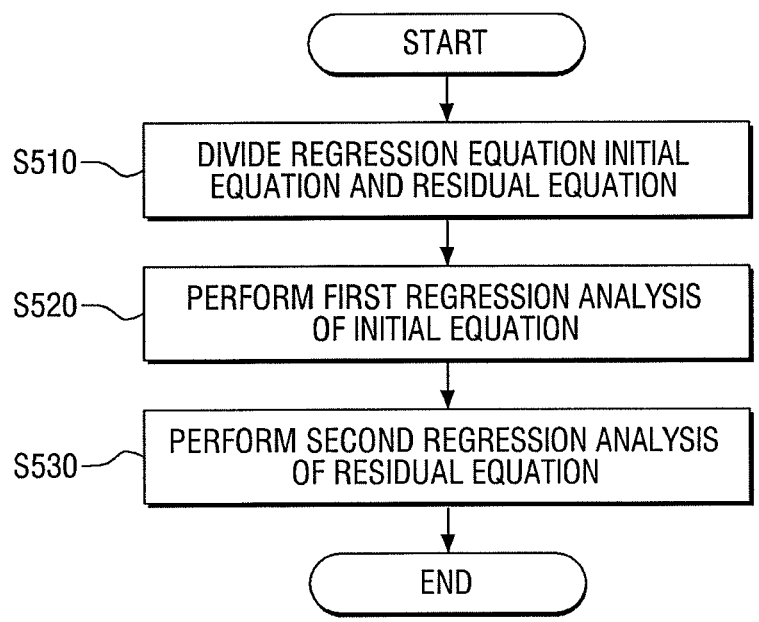
FIG. 20 illustrates an embodiment of an operation for correcting a regression equation.

FIG. 20 illustrates an embodiment of an operation for correcting the regression equation (operation S500) in the fabrication method of FIG. 19. Referring to FIG. 20, the regression equation is divided into an initial equation and a residual equation (operation S510). Here, the order of the initial equation may be equal to or smaller than that of the regression equation. The initial equation and the residual equation may be combined back into the regression equation.

The division of the regression equation into the initial equation and the residual equation may solve the problem of multicollinearity or collinearity. For example, coefficients of multi-collinear variables may be separated from each other, and a regression analysis may be performed on each of the coefficients. To this end, the multi-collinear variables should be separated from each other by the division of the regression equation into the initial equation and the residual equation.

As described above, collinearity is a problem among variables with similar tendencies, i.e., variables that are highly correlated. Therefore, collinearity is more likely to occur when the variables have different orders than when they have the same order. For this reason, the regression equation may be divided into the initial equation and the residual equation having different orders.

Next, a first regression analysis is performed on the initial equation (operation S520). After the first regression analysis of the initial equation, an alignment coefficient of the initial equation is determined.

Then, a second regression analysis is performed on the residual equation (operation S530). The residual equation may be a residual equation having the alignment coefficient of the initial equation determined by the first regression analysis. The second regression analysis of the residual equation may determine the remaining undetermined coefficients of the regression equation.

Figure 21:
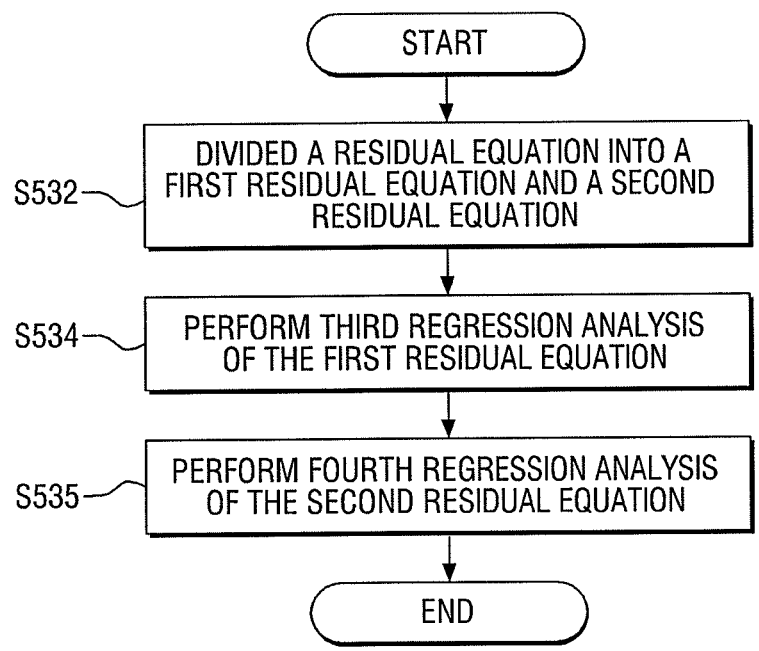
FIG. 21 illustrates an embodiment of an operation for performing a regression analysis of a residual equation.

FIG. 21 illustrates an embodiment of the regression analysis of the residual equation included in the fabrication method of FIG. 19. Referring to FIG. 21, the residual equation is divided into a first residual equation and a second residual equation (operation S532). The relationship between the first residual equation and the residual equation is similar to the relationship between the initial equation and the regression equation. The order of the first residual equation may be smaller than or equal to that of the residual equation. The first residual equation and the second residual equation may be combined into the residual equation. A third regression analysis of the first equation is performed (operation S534), and a fourth regression analysis of the second equation is performed (operation S535).

In FIG. 21, the residual equation is divided. In another embodiment, the first residual equation may also be divided. The number of times the residual equation is divided may be preset.

Figure 22:
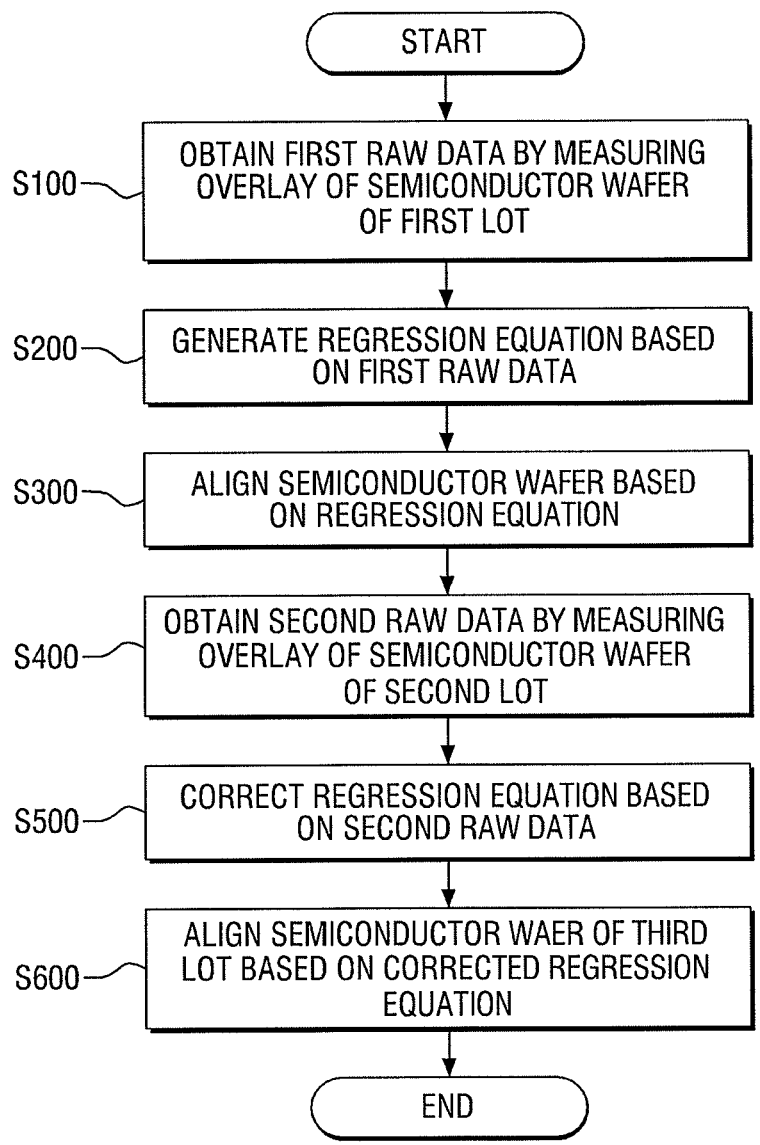
FIG. 22 illustrates another embodiment of a method for fabricating a semiconductor device.

FIG. 22 illustrates another embodiment of a method for fabricating a semiconductor device. Referring to FIG. 22, after a regression equation is corrected based on second raw data (operation S500), a semiconductor wafer of a third lot is aligned based on the corrected regression equation (operation S600). The third lot may include at least one semiconductor wafer. The first through third lots may each include an equal number of semiconductor wafers. The equal number of semiconductor wafers may be the number of semiconductor wafers that may be exposed to light or measured at a time.

In FIG. 22, the semiconductor wafers of up to the third lot are aligned. However, correcting the regression equation may be continuously repeated. Therefore, the regression equation may be corrected more precisely by continuously performing a regression analysis.

Figure 23:
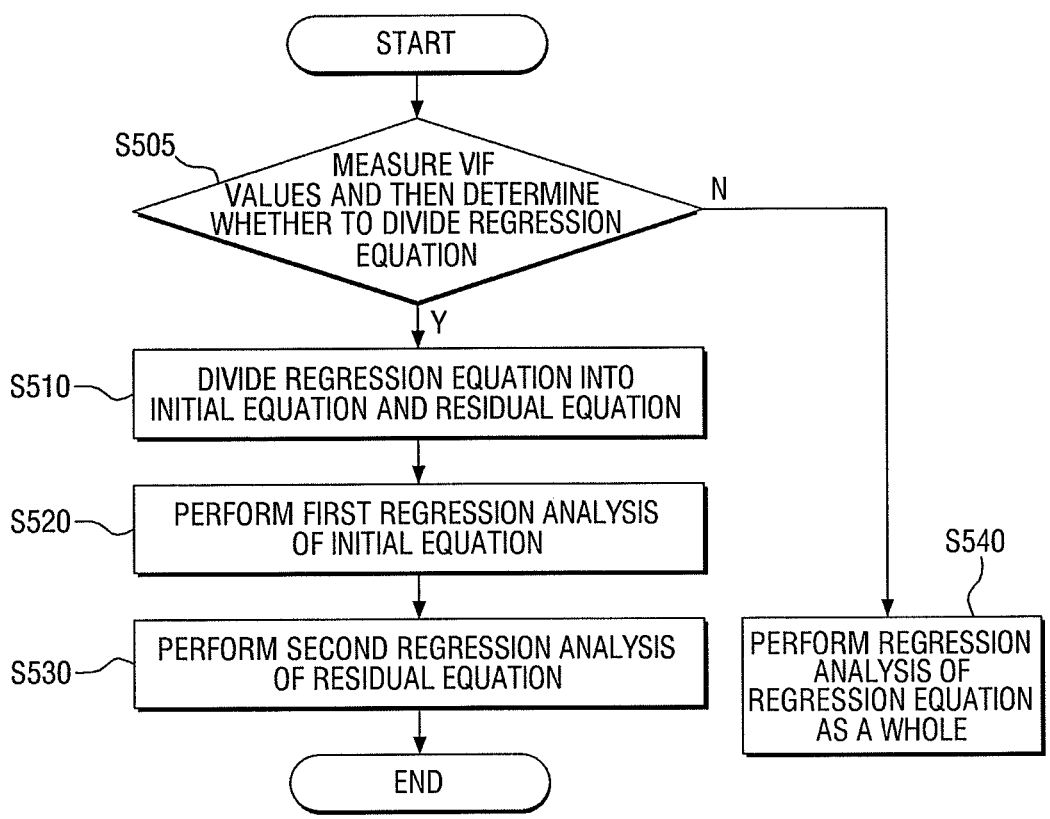
FIG. 23 illustrates another embodiment of a method for fabricating a semiconductor device.

FIG. 23 illustrates another embodiment of a method for fabricating a semiconductor device. Referring to FIG. 23, the method includes operation S500, in which a regression equation is corrected based on second raw data. Operation S500 may include a number of operations. First, it is determined whether to divide the regression equation by measuring a VIF value (operation S505).

The VIF value is a parameter having a value of one to infinity and is used to determine the presence of multicollinearity. In one embodiment, a variable having a VIF value of 10 or more may be determined to have multicollinearity. However, the criterion for multicollinearity may be different in another embodiment depending on situation.

If the regression equation has n independent variables and one dependent variable, a total number of variables is n+1. All of the data are quantitative variables. A VIF value of each independent variable may be given by Equation (2) described above.

In Equation (2), k is an integer of 1 to n, and $VIF_k$ is a VIF value of a $k^{th}$ independent variable. In addition, a value of $R_j^2$ is an R-squared value, e.g., the square of a correlation coefficient (R) obtained by performing a regression analysis by designating the $k^{th}$ independent variable as a dependent variable and the other (n−1) independent variables as independent variables. The independent variable is excluded from this regression analysis because multicollinearity is to measure correlations among input variables.

As the VIF value is closer to one, the degree of multicollinearity is lower. Conversely, as the VIF value is higher, the degree of multicollinearity is higher. Since the VIF value has a range of one to infinity, a reference value based on which the presence of multicollinearity may be determined is desired. In one embodiment, a variable having a VIF value of 10 or more is determined to have multicollinearity. In another embodiment, a particular reference value may be set.

When it is determined to divide the regression equation because the regression equation is determined to have collinearity based on the VIF value, the regression equation is divided into an initial equation and a residual equation (operation S510). Then, a first regression analysis is performed on the initial equation (operation S520), and a second regression analysis is performed on the residual equation (operation S530).

When it is determined not to divide the regression equation because the regression equation is determined to not have multicollinearity based on the VIF value, a regression analysis is performed on the regression equation as a whole (operation S540).

Figure 24:
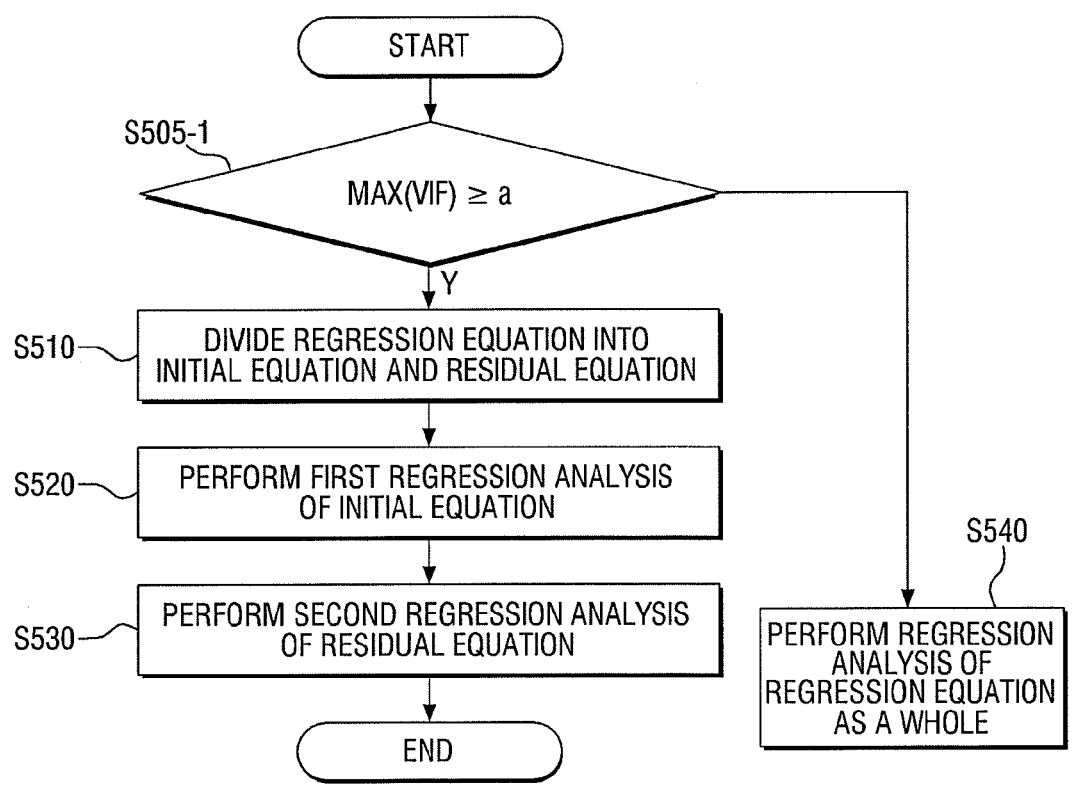
FIG. 24 illustrates another embodiment of a method for fabricating a semiconductor device.

FIG. 24 illustrates another embodiment of a method of fabricating a semiconductor device. Referring to FIG. 24, operation S500 in which a regression equation is corrected based on second raw data includes determining whether a maximum VIF value among VIF values is equal to or greater than a preset value a (operation S505-1).

If the maximum VIF value is equal to or greater than the preset value a, the regression equation is divided into an initial equation and a residual equation (operation S510). Then, a first regression analysis is performed on the initial equation (operation S520), and a second regression analysis is performed on the residual equation (operation S530). If the maximum VIF value is less than the preset value a, a regression analysis is performed on the regression equation as a whole (operation S540).

Figure 25:
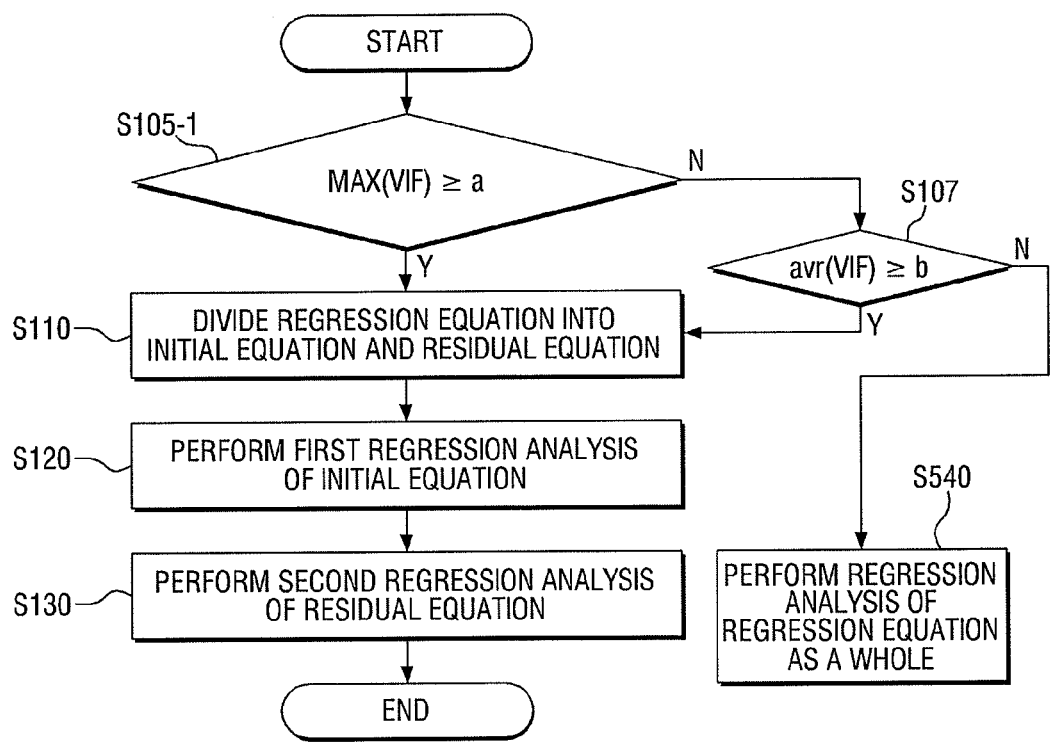
FIG. 25 illustrates another embodiment of a method for fabricating a semiconductor device.

FIG. 25 illustrates another embodiment of a method for fabricating a semiconductor device. Referring to FIG. 25, operation S500 for correcting a regression equation based on second raw data includes determining whether a maximum VIF value among VIF values is equal to or greater than a preset value a (operation S505-1) and whether an average value of the VIF values is equal to or greater than a preset value b (operation S507).

If the maximum VIF value is equal to or greater than the preset value a, the regression equation is divided into an initial equation and a residual equation (operation S510). Then, a first regression analysis is performed on the initial equation (operation S520), and a second regression analysis is performed on the residual equation (operation S530).

Even if the maximum VIF value is less than the preset value a, when the average value of the VIF values is equal to or greater than the preset value b, the regression equation is divided into the initial equation and the residual equation (operation S510). Then, a first regression analysis is performed on the initial equation (operation S520), and a second regression analysis is performed on the residual equation (operation S530).

If the maximum VIF value is less than the preset value a and if the average value of the VIF values is less than the preset value b, a regression analysis is performed on the regression equation as a whole (operation S540).

In accordance with the current embodiment, a method for fabricating a semiconductor device determines whether a variable has collinearity using both a maximum value and an average value. When it is determined that the variable does not have collinearity, the amount of computation may be reduced.

Figure 26:
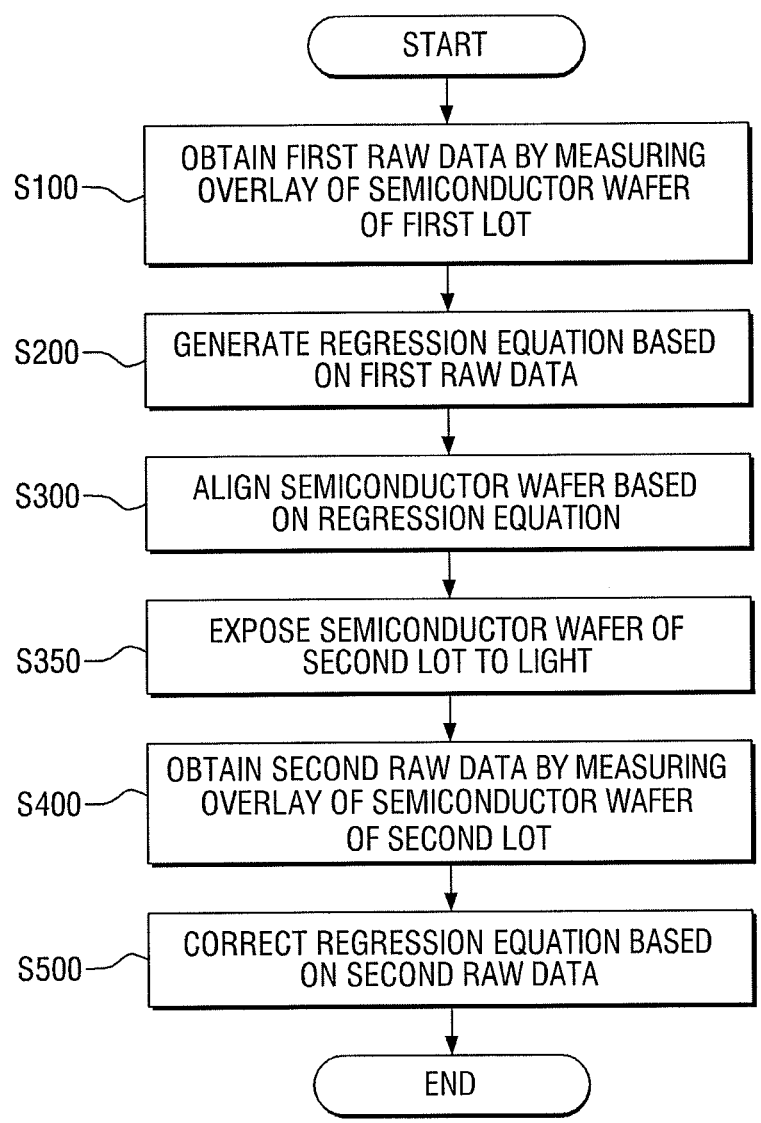
FIG. 26 illustrates another embodiment of a method for fabricating a semiconductor device.

FIG. 26 illustrates another embodiment of a method for fabricating a semiconductor device. Referring to FIGS. 1 and 26, the method includes aligning a semiconductor wafer of a second lot based on a regression equation (operation S300) and then exposing the semiconductor wafer of the second lot to light (operation S350). For example, measuring an overlay of the semiconductor wafer may be performed in the exposing of the semiconductor wafer to light. This is because the position of the semiconductor wafer is aligned for exposure to light. Therefore, the measuring of the overlay of the semiconductor wafer may be performed by, but not limited to, an exposure device.

Figure 27:
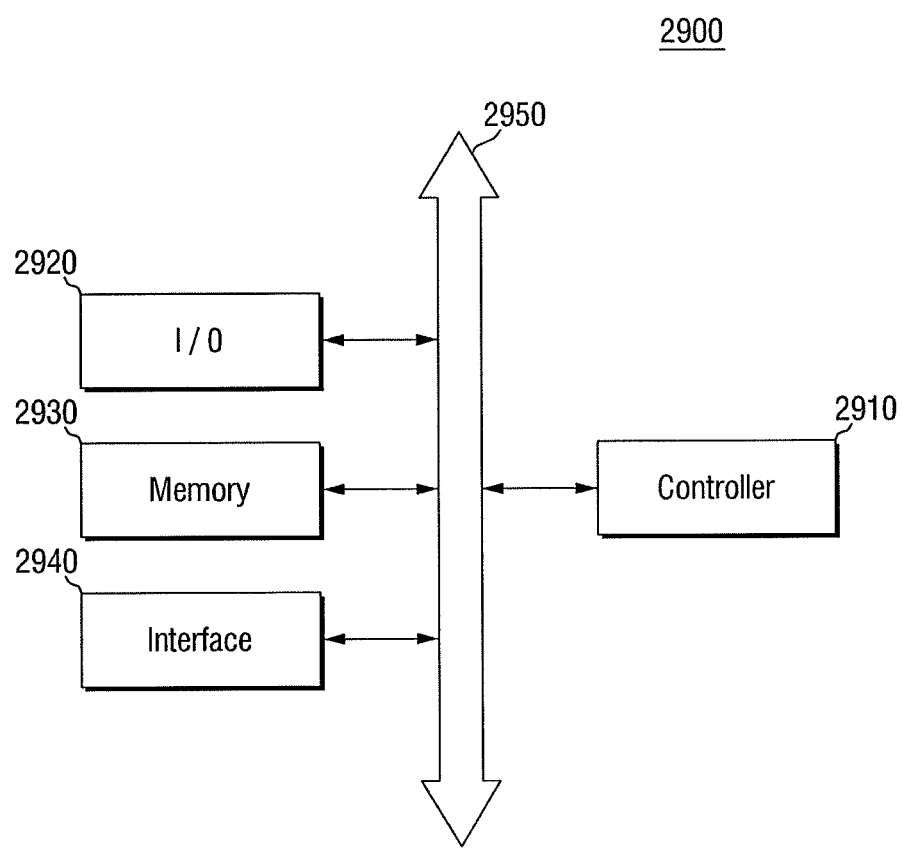
FIG. 27 illustrates an embodiment of an electronic system.

FIG. 27 illustrates an embodiment of an electronic system 2900 including a semiconductor device according to any of the aforementioned embodiments. Referring to FIG. 27, the electronic system 2900 includes a controller 2910, an input/output (I/O) device 2920, a memory device 2930, an interface 2940 and a bus 2950. The controller 2910, the I/O device 2920, the memory device 2930 and/or the interface 2940 may be connected to one another by the bus 2950. The bus 2950 may serve as a path for transmitting data.

The controller 2910 may include at least one of a microprocessor, a digital signal processor, a microcontroller and logic devices capable of performing similar functions to those of a microprocessor, a digital signal processor and a microcontroller. The I/O device 2920 may include a keypad, a keyboard and a display device.

The memory device 2930 may store data and/or commands. The memory device 2930 may include a semiconductor device. In one embodiment, the memory device 2930 includes a dynamic random access memory (DRAM). The interface 2940 may be used to transmit data to or receive data from a communication network. The interface 2940 may be a wired or wireless interface. In an example, the interface 1140 may include an antenna or a wired or wireless transceiver.

The electronic system 2900 may be applied to nearly all types of electronic products capable of transmitting or receiving information in a wireless environment, such as a personal data assistant (PDA), a portable computer, a web tablet, a wireless phone, a mobile phone, a digital music player, a memory card, etc.

Figure 28:
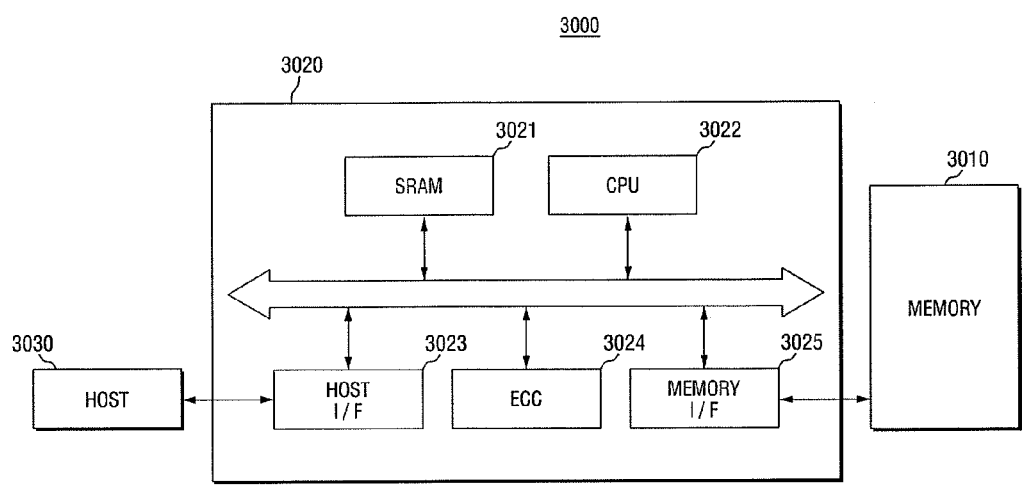
FIG. 28 illustrates an embodiment of a memory card.

FIG. 28 illustrates an embodiment of a memory card 3000 including semiconductor devices fabricated using any of the aforementioned method embodiments. Referring to FIG. 28, a memory 3010 including the semiconductor devices may be employed in the memory card 3000. The memory card 3000 may include a memory controller 3020 which controls data exchange between a host 3030 and the memory 3010. A static random access memory (SRAM) 3021 may be used as an operating memory of a central processing unit (CPU) 3022. A host interface 3023 may include a protocol used by the host 3030 to access the memory card 3000 and exchange data with the memory card 3000. An error correction code (ECC) 3024 may detect and correct errors included in data read from the memory 3010. A memory interface 3025 may interface with the memory 3010. The CPU 3022 may perform the overall control operation for data exchange of the memory controller 3020.

Figure 29:
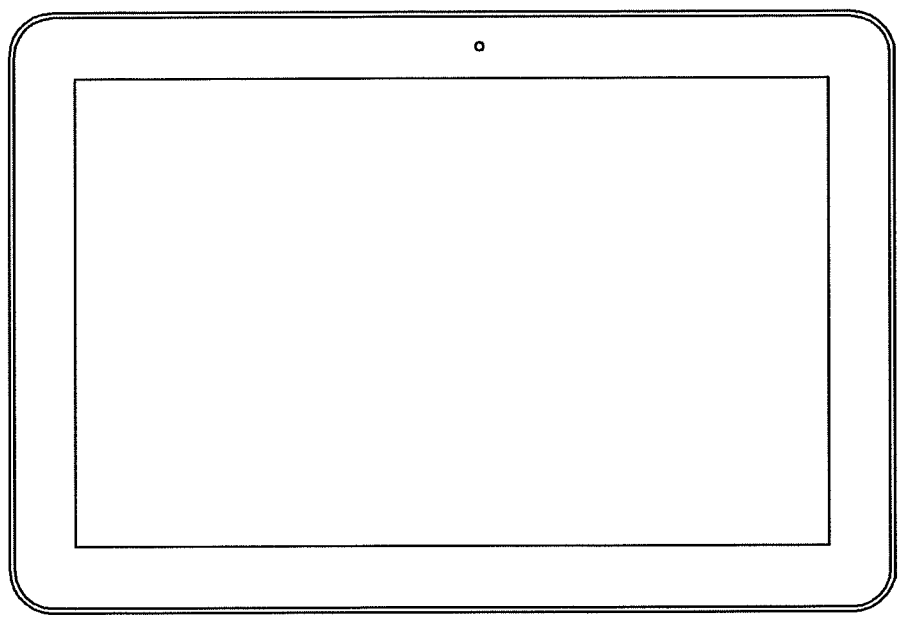
FIGS. 29 and 30 illustrate examples of a semiconductor system.
Figure 30:
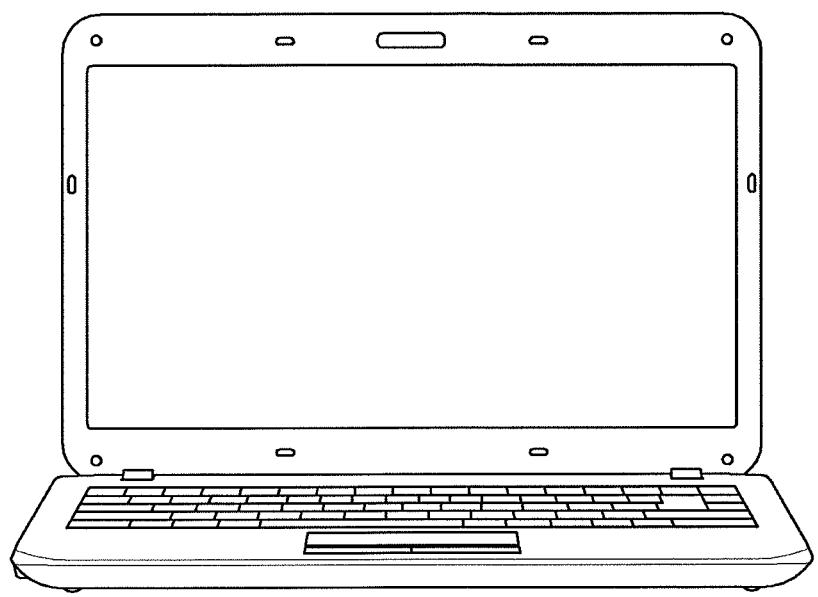

FIGS. 29 and 30 illustrating examples of semiconductor systems including semiconductor devices according to any of the aforementioned embodiments. FIG. 29 illustrates a tablet personal computer (PC), and FIG. 30 illustrates a notebook computer. The semiconductor devices may also be applied to various IC devices other than those set forth herein in other embodiments.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments described herein.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
   obtaining first raw data by measuring an overlay of a semiconductor wafer of a first lot;
   generating a regression equation based on the first raw data;
   aligning a semiconductor wafer of a second lot based on a coefficient of the regression equation;
   obtaining second raw data by measuring an overlay of the aligned semiconductor wafer of the second lot; and
   correcting the regression equation based on the second raw data, wherein the correcting of the regression equation includes:
   dividing the regression equation into an initial equation and a residual equation excluding the initial equation from the regression equation;
   correcting a coefficient of the initial equation by performing a first regression analysis of the initial equation based on the second raw data; and
   correcting a coefficient of the residual equation by applying the coefficient of the initial equation to the regression equation and performing a second regression analysis of the regression equation having the coefficient of the initial equation.

2. The method as claimed in claim 1, wherein an order of the initial equation is smaller than or equal to that of the regression equation.

3. The method as claimed in claim 1, wherein the first raw data includes:
   a coordinate of the semiconductor wafer of the first lot in a first direction and a coordinate of the semiconductor wafer of the first lot in a second direction intersecting the first direction.

4. The method as claimed in claim 3, wherein variables of the regression equation include one or more of a coordinate in the first direction, a coordinate in a second direction, powers of the coordinates in the first direction and the second direction, and a product of the coordinate in the first direction and the coordinate in the second direction.

5. The method as claimed in claim 1, further comprising:
   aligning a semiconductor wafer of a third lot based on the coefficient of the corrected regression equation.

6. The method as claimed in claim 1, wherein the regression equation has a third or higher order.

7. The method as claimed in claim 1, wherein performing the second regression analysis includes:
   dividing the residual equation into a first residual equation of an order smaller than or equal to that of the residual equation and a second residual equation excluding the first residual equation from the residual equation;
   correcting a coefficient of the first residual equation by performing a third regression analysis of the first residual equation based on the second raw data; and
   correcting a coefficient of the second residual equation by performing a fourth regression analysis of the second residual equation based on the second raw data.

8. The method as claimed in claim 1, wherein the order of the initial equation is greater than or equal to that of the residual equation.

9. The method as claimed in claim 1, wherein dividing the regression equation includes determining whether to divide the regression equation by measuring variation inflation factor (VIF) values of the variables of the regression equation.

10. The method as claimed in claim 9, wherein determining whether to divide the regression equation includes:
    performing a regression analysis of the regression equation as a whole without dividing the regression equation if a maximum value among the VIF values is less than a preset first value,
    dividing the regression equation into the initial equation and the residual equation if the maximum value among the VIF values is equal to or greater than the first value, and performing the first regression analysis and the second regression analysis.

11. The method as claimed in claim 10, wherein determining whether to divide the regression equation includes:
    performing a regression analysis of the regression equation as a whole without dividing the regression equation if the maximum value among the VIF values is less than the preset first value,
    dividing the regression equation into the initial equation and the residual equation if the maximum value among the VIF values is equal to or greater than the first value or if an average value of the VIF values is equal to or greater than a preset second value, and
    performing the first regression analysis and the second regression analysis.

12. The method as claimed in claim 1, wherein:
    the regression equation includes a first regression equation and a second regression equation, and aligning the semiconductor wafer of the second lot includes:
  aligning a coordinate of the semiconductor wafer of the second lot in the first direction using the first regression equation, and
  aligning a coordinate of the semiconductor wafer of the second lot in the second direction, which intersects the first direction, using the second regression equation.

13. The method as claimed in claim 1, wherein the order of the initial equation is equal to a lowest order among orders of terms of the regression equation.

14. An apparatus for fabricating a semiconductor device, comprising:
  an input to receive first raw data based on an overlay measurement of a semiconductor wafer of a first lot;
  a processor to perform operations including:
    a) generating a regression equation based on the first raw data;
    b) aligning a semiconductor wafer of a second lot based on a coefficient of the regression equation;
    c) obtaining second raw data by measuring an overlay of the aligned semiconductor wafer of the second lot; and
    d) correcting the regression equation based on the second raw data; and
  an output to output information including the corrected regression equation to perform a semiconductor alignment operation prior to light exposure, wherein the processor is to correct the regression equation by:
    dividing the regression equation into an initial equation and a residual equation excluding the initial equation from the regression equation;
    correcting a coefficient of the initial equation by performing a first regression analysis of the initial equation based on the second raw data; and
    correcting a coefficient of the residual equation by applying the coefficient of the initial equation to the regression equation and performing a second regression analysis of the regression equation having the coefficient of the initial equation.

15. The apparatus as claimed in claim 14, wherein an order of the initial equation is smaller than or equal to that of the regression equation.

16. The apparatus as claimed in claim 14, wherein the first raw data includes:
  a coordinate of the semiconductor wafer of the first lot in a first direction and a coordinate of the semiconductor wafer of the first lot in a second direction intersecting the first direction.

17. The apparatus as claimed in claim 14, wherein variables of the regression equation include one or more of a coordinate in the first direction, a coordinate in a second direction, powers of the coordinates in the first direction and the second direction, and a product of the coordinate in the first direction and the coordinate in the second direction.

18. The apparatus as claimed in claim 14, wherein performing the second regression analysis includes:
  dividing the residual equation into a first residual equation of an order smaller than or equal to that of the residual equation and a second residual equation excluding the first residual equation from the residual equation;
  correcting a coefficient of the first residual equation by performing a third regression analysis of the first residual equation based on the second raw data; and
  correcting a coefficient of the second residual equation by performing a fourth regression analysis of the second residual equation based on the second raw data.

* * * * *